(12) United States Patent
Saito et al.

(10) Patent No.: US 11,652,033 B2
(45) Date of Patent: *May 16, 2023

(54) SEMICONDUCTOR DEVICE

(71) Applicant: Rohm Co., Ltd., Kyoto (JP)

(72) Inventors: Koshun Saito, Kyoto (JP); Hiroyuki Sakairi, Kyoto (JP); Yasufumi Matsuoka, Kyoto (JP); Kenichi Yoshimochi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 35 days.

This patent is subject to a terminal disclaimer.

(21) Appl. No.: 17/373,165

(22) Filed: Jul. 12, 2021

(65) Prior Publication Data
US 2021/0343629 A1    Nov. 4, 2021

Related U.S. Application Data

(63) Continuation of application No. 16/862,968, filed on Apr. 30, 2020, now Pat. No. 11,081,433.

(30) Foreign Application Priority Data

May 13, 2019 (JP) .............................. JP2019-090488

(51) Int. Cl.
*H01L 23/495* (2006.01)
*H01L 23/00* (2006.01)

(52) U.S. Cl.
CPC .... *H01L 23/49575* (2013.01); *H01L 23/4952* (2013.01); *H01L 23/49503* (2013.01);
(Continued)

(58) Field of Classification Search
CPC ........... H01L 23/49575; H01L 23/4952; H01L 23/49562; H01L 24/48; H01L 23/49503; H01L 2924/30107; H01L 2224/48245; H01L 2924/1033; H01L 2924/10271; H01L 2924/10253; H01L 2924/10329; H01L 2924/1067; H01L 2924/13091; H01L 2924/13064; H01L 2924/13055; H01L 2924/30101; H01L 23/3107;
(Continued)

(56) References Cited

U.S. PATENT DOCUMENTS

2018/0040540 A1   2/2018   Kasuya et al.
2018/0108598 A1   4/2018   Niu et al.

FOREIGN PATENT DOCUMENTS

JP    2003-218309 A    7/2003

*Primary Examiner* — Robert G Bachner
(74) *Attorney, Agent, or Firm* — Hamre, Schumann, Mueller & Larson, P.C.

(57) ABSTRACT

A semiconductor device provided with first and second semiconductor element each having an obverse and a reverse surface with a drain electrode, source electrode and gate electrode provided on the obverse surface. The semiconductor device is also provided with a control element electrically connected to the gate electrodes of the respective semiconductor elements, and with a plurality of leads, which include a first lead carrying the first semiconductor element, a second lead carrying the second semiconductor element, and a third lead carrying the control element. The first and second leads overlap with each other as viewed in a first direction perpendicular to the thickness direction of the semiconductor device, and the third lead overlaps with the first and second leads as viewed in a second direction perpendicular to the thickness direction and the first direction.

20 Claims, 12 Drawing Sheets

(52) U.S. Cl.
CPC ........ *H01L 23/49562* (2013.01); *H01L 24/48* (2013.01); *H01L 2224/48245* (2013.01); *H01L 2924/1033* (2013.01); *H01L 2924/1067* (2013.01); *H01L 2924/10253* (2013.01); *H01L 2924/10271* (2013.01); *H01L 2924/10329* (2013.01); *H01L 2924/13055* (2013.01); *H01L 2924/13064* (2013.01); *H01L 2924/13091* (2013.01); *H01L 2924/30101* (2013.01); *H01L 2924/30107* (2013.01)

(58) Field of Classification Search
CPC ......... H01L 23/49524; H01L 23/49548; H01L 2224/0603; H01L 2924/181; H01L 2224/40245; H01L 2224/48247; H01L 2224/49171; H01L 2224/48137; H01L 23/5386

See application file for complete search history.

SEMICONDUCTOR DEVICE

FIELD

The present disclosure relates to a semiconductor device provided with a plurality of semiconductor elements.

BACKGROUND

Semiconductor devices produced by molding a plurality of semiconductor elements with a single resin member are known. Such semiconductor devices are called a "system in package". JP 2003-218309 A discloses a semiconductor device in which two switching elements and a control IC are packaged together. The control IC is a semiconductor element for controlling the switching elements, which perform switching operations in accordance with signals from the control IC. Such a semiconductor device is installed on a circuit board of an electronic device used in a power circuit of a DC/DC converter, for example.

In recent years, for saving energy and improving performance of electronic devices, there is a demand for reduction in power consumption as well as improvement in switching operation responsiveness. To this end, an effective option may be to reduce parasitic inductance and parasitic resistance.

SUMMARY

In light of the foregoing, an object of the present disclosure is to provide a semiconductor device in which a plurality of semiconductor elements are packaged and a parasitic inductance and a parasitic resistance are reduced.

According to the present disclosure, there is provided a semiconductor device comprising: a first semiconductor element including a first obverse surface and a first reverse surface that are spaced apart in a thickness direction, where the first obverse surface is provided with a first drain electrode, a first source electrode, and a first gate electrode; a second semiconductor element including a second obverse surface and a second reverse surface that are spaced apart in the thickness direction, where the second obverse surface is provided with a second drain electrode, a second source electrode, and a second gate electrode; a control element electrically connected to the first gate electrode and the second gate electrode; and a plurality of leads spaced apart from each other. The plurality of leads include a first lead opposed to the first reverse surface and on which the first semiconductor element is mounted, a second lead opposed to the second reverse surface and on which the second semiconductor element is mounted, and a third lead on which the control element is mounted. The first lead and the second lead overlap with each other as viewed in a first direction perpendicular to the thickness direction, and the third lead overlaps with the first lead and the second lead as viewed in a second direction perpendicular to the thickness direction and the first direction.

With the semiconductor device of the present disclosure, it is possible to reduce parasitic inductance and parasitic resistance in a semiconductor device with a plurality of semiconductor elements and a control element being packaged together.

EMBODIMENTS

Figure 1:
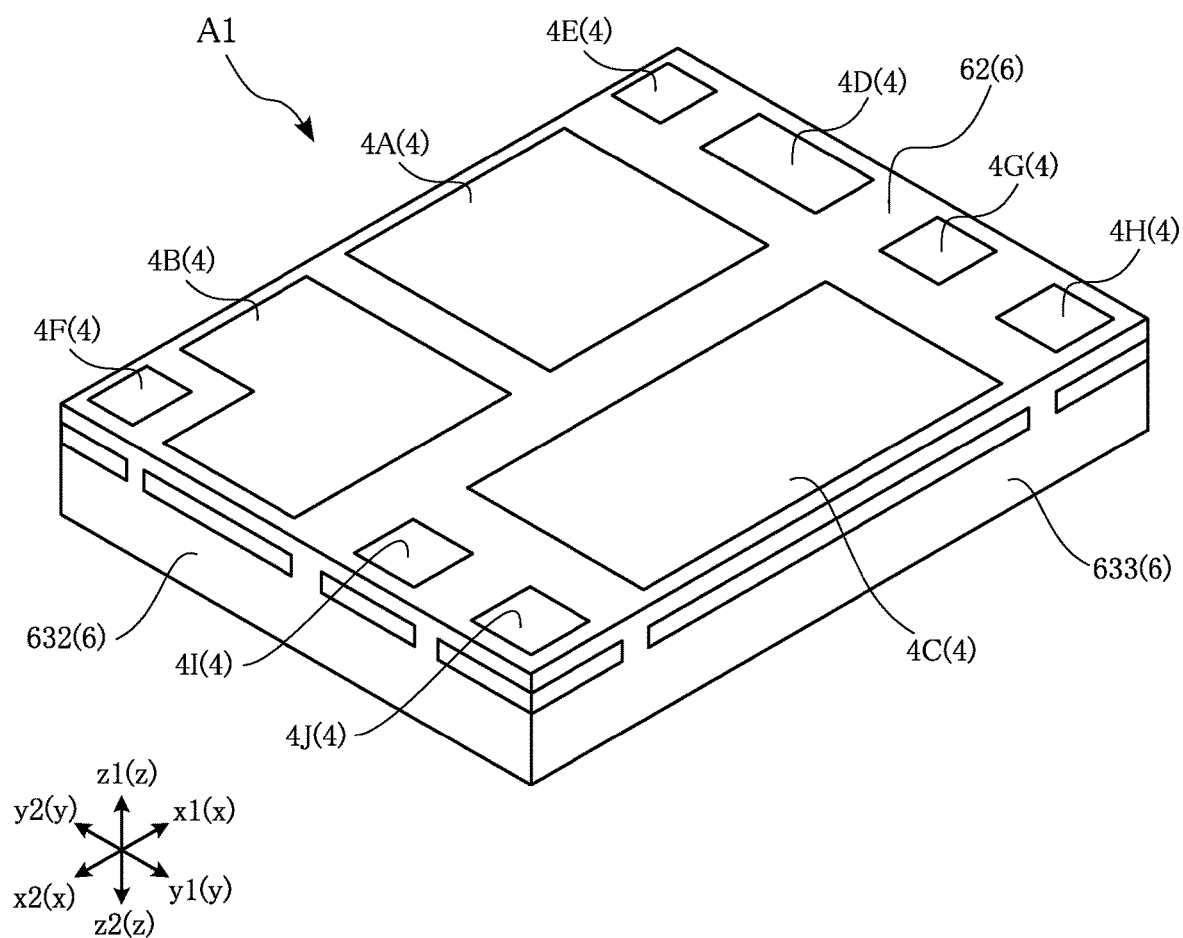
FIG. 1 is a perspective view showing a semiconductor device according to a first embodiment.

Embodiments of a semiconductor device of the present disclosure will be described below with reference to the drawings. It should be noted that the same or similar constituent elements are denoted by the same reference numeral, and the descriptions are omitted.

In the present disclosure, the term "an object A and an object B overlap with each other as viewed in a certain direction" encompasses a case where the object A and object B overlap "entirely" with each other and a case where the object A and object B overlap "only partially" with each other. The terms "first", "second", "third", and so on in the present disclosure may be used merely as labels, and not necessarily used to sequence the subjects in the numerical order.

A semiconductor device A1 according to a first embodiment will be described with reference to FIGS. 1 to 7. The semiconductor device A1 is to be used in a power converter such as an inverter or a converter, for example.

First, a module structure of the semiconductor device A1 according to the first embodiment will be described with reference to FIGS. 1 to 6. The module structure of the semiconductor device A1 includes two semiconductor elements 1 and 2, a control element 3, a lead frame 4, a plurality of connection members 5, and a sealing member 6. In the semiconductor device A1, the lead frame 4 includes a plurality of leads 4A to 4J that are separate from one another. The plurality of connection members 5 include a plurality of wires 5A to 5N.

Figure 2:
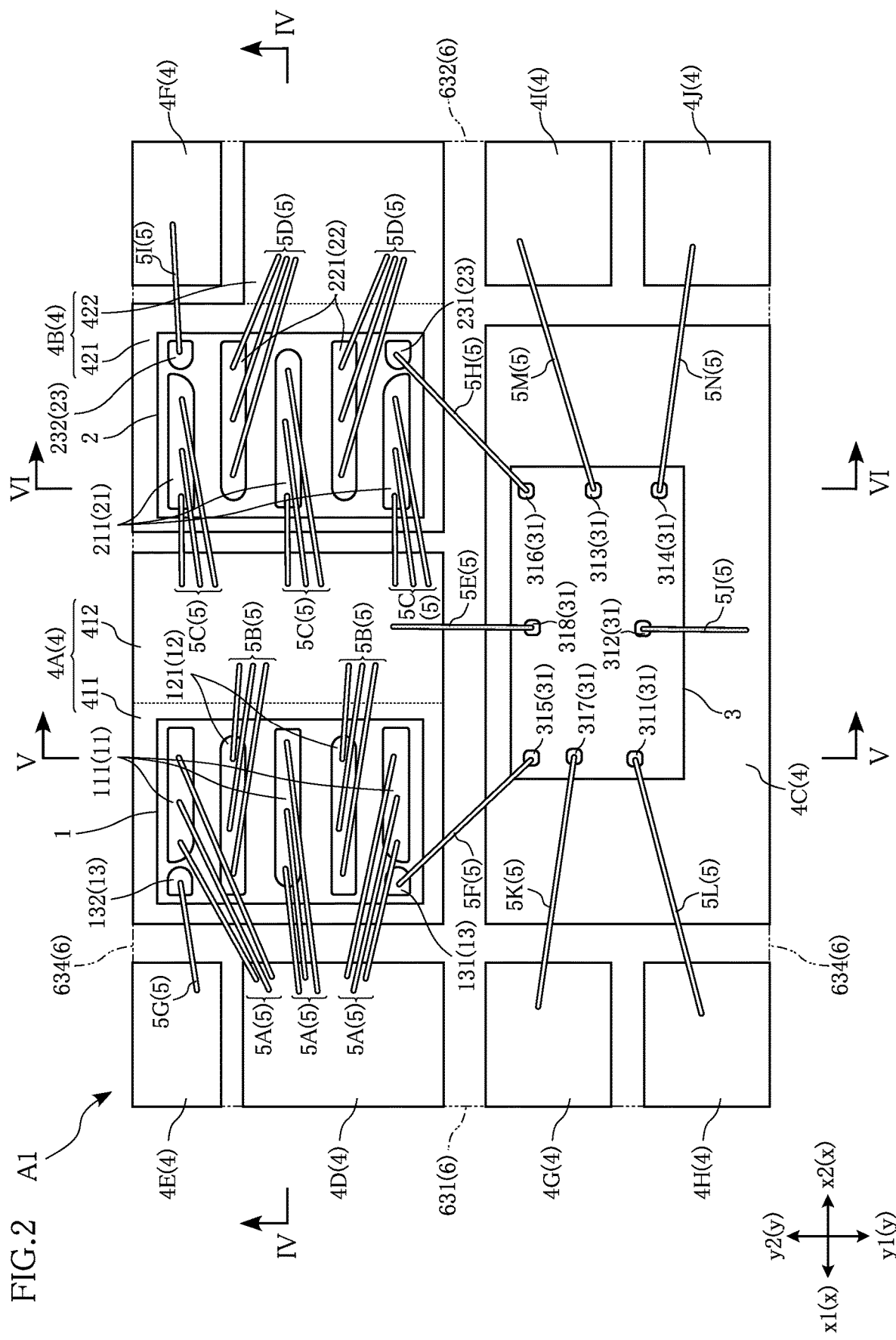
FIG. 2 is a plan view showing the semiconductor device of the first embodiment.
Figure 3:
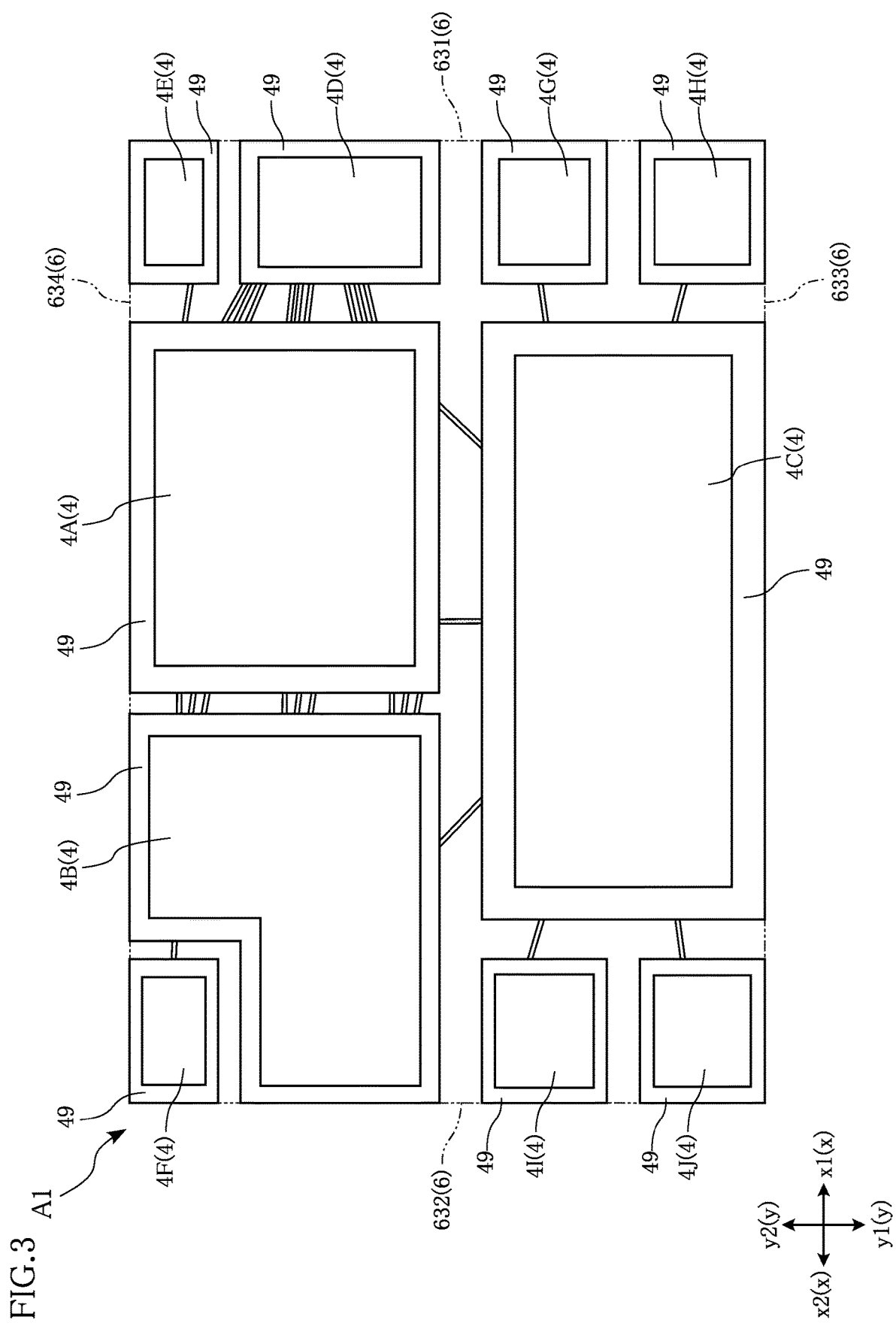
FIG. 3 is a bottom view showing the semiconductor device of the first embodiment.
Figure 4:
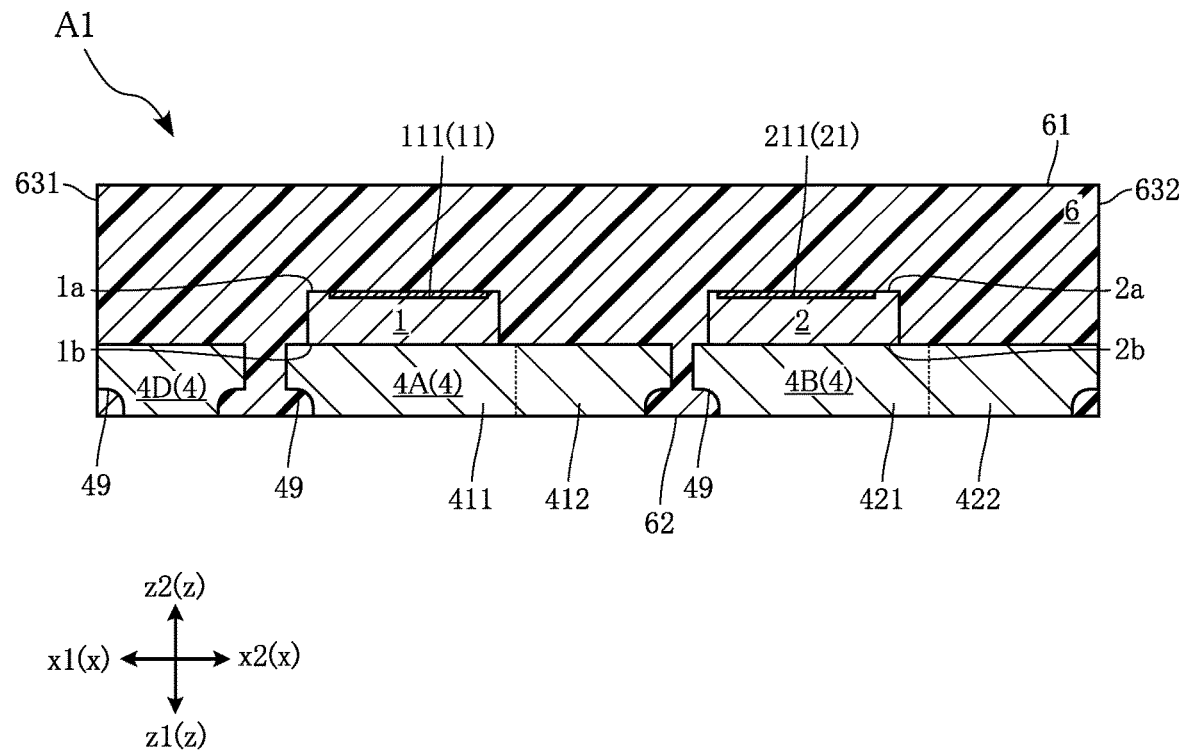
FIG. 4 is a cross-sectional view taken along line IV-IV in FIG. 2.
Figure 5:
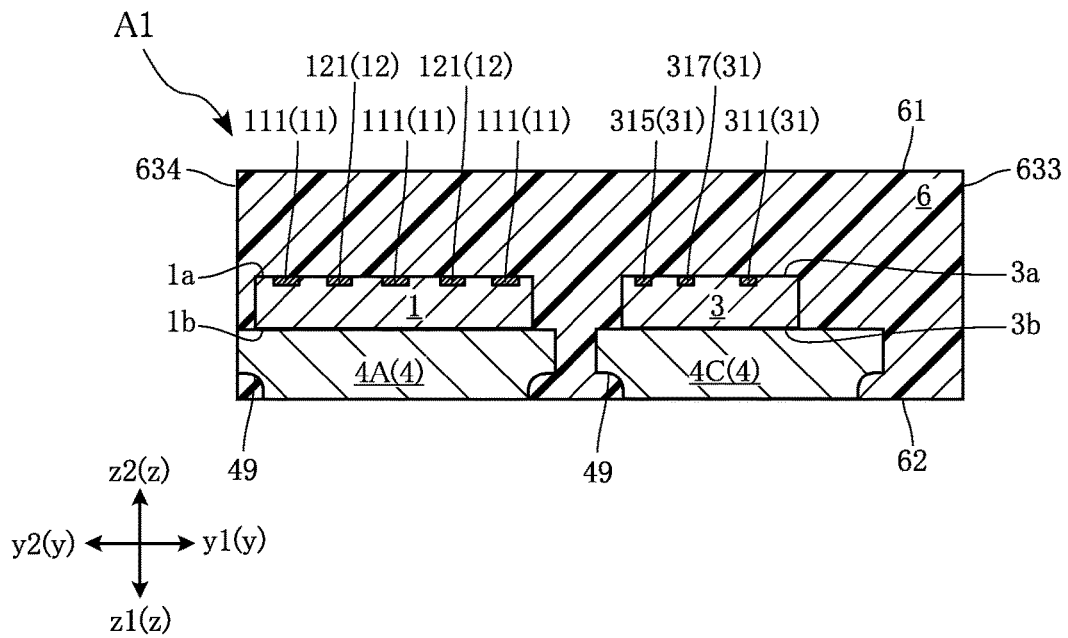
FIG. 5 is a cross-sectional view taken along line V-V in FIG. 2.
Figure 6:
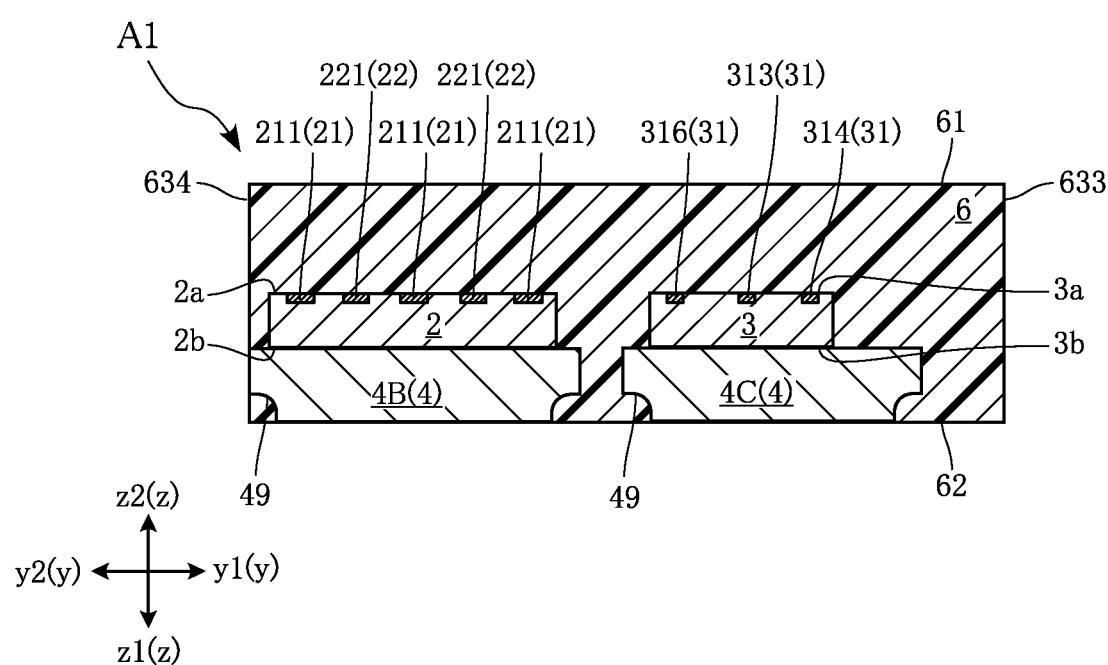
FIG. 6 is a cross-sectional view taken along line VI-VI in FIG. 2.

FIG. 1 is a perspective view showing the semiconductor device A1 as viewed from the bottom face side. FIG. 2 is a plan view showing the semiconductor device A1, and the sealing member 6 is shown with an imaginary line (two-dot dash line). FIG. 3 is a bottom view showing the semiconductor device A1, and the sealing member 6 is shown with an imaginary line (two-dot dash line). FIG. 4 is a cross-sectional view taken along line IV-IV in FIG. 2. FIG. 5 is a cross-sectional view taken along line V-V in FIG. 2. FIG. 6 is a cross-sectional view taken along line VI-VI in FIG. 2. It should be noted that, in FIGS. 4 to 6, the plurality of connection members 5 are not shown.

For illustrative reasons, three directions that are perpendicular to one another are defined as an x direction, a y direction, and a z direction. The z direction is a thickness direction of the semiconductor device A1. The x direction is a left-right direction in the plan view of the semiconductor device A1 (see FIG. 2). The y direction is a vertical direction in the plan view of the semiconductor device A1 (see FIG. 2). One side in the x direction is taken as an x1 side, and the other side in the x direction is taken as an x2 side. Similarly, one side in the y direction is taken as a y1 side and the other side in the y direction is taken as a y2 side, and one side in the z direction is taken as a z1 side and the other side in the z direction is taken as a z2 side. In the present disclosure, the z1 side may also be referred to as the "lower side", and the z2 side may also be referred to as the "upper side". The x direction and the y direction correspond to the "first direction" and the "second direction" recited in the claims, respectively.

The semiconductor device A1 is to be installed on a circuit board of an electronic device or the like. The semiconductor device A1 is a surface mount package structure, for example. In this embodiment, the semiconductor device A1 is of a package type called "SON (Small Outline Non-Lead)", for example.

Both of the two semiconductor elements 1 and 2 are elements that exert an electrical function of the semiconductor device A1. The semiconductor elements 1 and are switching elements, and are n-type MOSFETs, for example. It should be noted that the semiconductor elements 1 and 2 are not limited to n-type MOSFETs, and may also be p-type MOSFETs. In addition, the semiconductor elements 1 and 2 are not limited to MOSFETs, and may also be field effect transistors such as MISFETs (Metal-Insulator-Semiconductor FETs) and HEMTs (High Electron Mobility Transistors), bipolar transistors, or other transistors such as IGBTs (Insulated Gate Bipolar Transistors).

As shown in FIG. 2, the semiconductor elements 1 and 2 have a rectangular shape, for example, in a plan view (as viewed in the z direction). The semiconductor element 1 is mounted on the lead 4A, and the semiconductor element 2 is mounted on the lead 4B. As shown in FIGS. 2 and 4, the two semiconductor elements 1 and 2 are disposed side by side in the x direction. In the illustrated example, the two elements 1 and 2 are aligned with each other along the x direction with a predetermined space present between them in plan view. The constituent materials of the semiconductor elements 1 and 2 include GaN (gallium nitride), for example. It should be noted that the constituent materials of the semiconductor elements 1 and 2 are not limited to GaN, and may also include SiC (silicon carbide), Si (silicon), GaAs (gallium arsenide), or $Ga_2O_3$ (gallium oxide), for example. The semiconductor element 1 corresponds to the "first semiconductor element" recited in the claims, and the semiconductor element 2 corresponds to the "second semiconductor element" recited in the claims.

The semiconductor element 1 includes an element obverse surface 1a and an element reverse surface 1b. The element obverse surface 1a and the element reverse surface 1b are spaced apart from each other in the z direction. The element obverse surface 1a faces the z2 side, and the element reverse surface 1b faces the z1 side. The element reverse surface 1b is opposed to the lead 4A. The element obverse surface 1a corresponds to the "first obverse surface" recited in the claims, and the element reverse surface 1b corresponds to the "first reverse surface" recited in the claims.

The semiconductor element 1 is a three-terminal element that includes three electrodes. In this embodiment, the semiconductor element 1 includes a drain electrode 11, a source electrode 12, and a gate electrode 13. The drain electrode 11, the source electrode 12, and the gate electrode 13 are arranged on the element obverse surface 1a. The drain electrode 11 corresponds to the "first drain electrode" recited in the claims, the source electrode 12 corresponds to the "first source electrode" recited in the claims, and the gate electrode 13 corresponds to the "first gate electrode" recited in the claims.

The drain electrode 11 includes a plurality of pad portions 111. The pad portions 111 have a band shape extending in the x direction. The pad portions 111 are electrically connected to a drain region inside the semiconductor element 1. The source electrode 12 includes a plurality of pad portions 121. The pad portions 121 have a band shape extending in the x direction. The pad portions 121 are electrically connected to a source region inside the semiconductor element 1. The pad portions 111 and the pad portions 121 are disposed side by side in the y direction in an alternately arranged manner. The gate electrode 13 includes two pad portions 131 and 132. The pad portions 131 and 132 are electrically connected to a gate region (channel region) inside the semiconductor element 1. The pad portions 131 and 132 are arranged on the edge portion that is located on the side farther away from the semiconductor element 2 in the x direction. The two pad portions 131 and 132 are spaced apart from each other in the y direction. In the example shown in FIG. 2, the pad portion 131 is arranged at the corner portion on the x1 side and the y1 side in a plan view. The pad portion 132 is arranged at the corner portion on the x1 side and the y2 side in a plan view. The two pad portions 131 and 132 have the same electrical potential. It should be noted that the gate electrode 13 does not need to include the pad portion 132. The pad portions 131 and 132 correspond to the "first pad portions" recited in the claims.

A driving signal is input to the semiconductor element from the control element 3, and the electrical communication state and the blocked state are switched in accordance with the driving signal (switching operation is performed). The driving signal is input to the gate electrode 13. The semiconductor element 1 corresponds to the "first semiconductor element" recited in the claims.

The semiconductor element 2 includes an element obverse surface 2a and an element reverse surface 2b. The element obverse surface 2a and the element reverse surface 2b are spaced apart from each other in the z direction. The element obverse surface 2a faces the z2 side, and the element reverse surface 2b faces the z1 side. The element reverse surface 2b is opposed to the lead 4B. The element obverse surface 2a corresponds to the "second obverse surface" recited in the claims, and the element reverse surface 2b corresponds to the "second reverse surface" recited in the claims.

The semiconductor element 2 is a three-terminal element that includes three electrodes. In this embodiment, the semiconductor element 2 includes a drain electrode 21, a source electrode 22, and a gate electrode 23. The drain electrode 21, the source electrode 22, and the gate electrode 23 are arranged on the element obverse surface 2a. The drain electrode 21 corresponds to the "second drain electrode" recited in the claims, the source electrode 22 corresponds to the "second source electrode" recited in the claims, and the gate electrode 23 corresponds to the "second gate electrode" recited in the claims.

The drain electrode 21 includes a plurality of pad portions 211. The pad portions 211 have a band shape extending in the x direction. The pad portions 211 are electrically connected to a drain region inside the semiconductor element 2. The source electrode 22 includes a plurality of pad portions 221. The pad portions 221 have a band shape extending in the x direction. The pad portions 221 are electrically connected to a source region inside the semiconductor element 2. The pad portions 211 and the pad portions 221 are disposed side by side in the y direction in an alternately arranged manner. The gate electrode 23 includes two pad portions 231 and 232. The pad portions 231 and 232 are electrically connected to a gate region (channel region) inside the semiconductor element 2. The pad portions 231 and 232 are arranged on the edge portion that is located on the side farther away from the semiconductor element 1 in the x direction. The two pad portions 231 and 232 are spaced apart from each other in the y direction. In the example shown in FIG. 2, the pad portion 231 is arranged at the corner portion on the x2 side and the y1 side in a plan view. The pad portion 232 is arranged at the corner portion on the x2 side and the y2 side in a plan view. The two pad portions 231 and 232 have the same electrical potential. It should be noted that the gate electrode 23 does not need to include the pad portion 232. The pad portions 231 and 232 correspond to the "second pad portions" recited in the claims.

A driving signal is input to the semiconductor element 2 from the control element 3, and the electrical communication state and the blocked state are switched in accordance with the driving signal (switching operation is performed). The driving signal is input to the gate electrode 23. The semiconductor element 2 corresponds to the "second semiconductor element" recited in the claims.

The control element 3 controls the switching operations performed by the two semiconductor elements 1 and 2. The control element 3 generates the driving signals for driving the semiconductor elements 1 and 2, and outputs the generated driving signals to the semiconductor elements 1 and 2. The control element 3 is an IC (Integrated Circuit), for example. The control element 3 is a semiconductor element made of a material including a semiconductor material. The control element 3 is mounted on the lead 4C. The control element 3 overlaps with portions of the semiconductor elements 1 and 2 as viewed in the y direction.

The control element 3 includes an element obverse surface 3a and an element reverse surface 3b. The element obverse surface 3a and the element reverse surface 3b are spaced apart from each other in the z direction. The element obverse surface 3a faces the z2 side, and the element reverse surface 3b faces the z1 side. The element reverse surface 3b is opposed to the lead 4C.

The control element 3 includes an element electrode 31. The element electrode 31 is arranged on the element obverse surface 3a. The element electrode 31 includes a plurality of pad portions 311 to 318. Each of the plurality of pad portions 311 to 318 serves as an input end or output end in the control element 3. The pad portions 311 to 318 are portions to which the connection members 5 are joined. The arrangement of the pad portions 311 to 318 in a plan view is not limited to that in the example shown in FIG. 2.

One end of a wire 5L is joined to the pad portion 311, and the pad portion 311 is electrically connected to the lead 4H via the wire 5L. One end of a wire 5J is joined to the pad portion 312, and the pad portion 312 is electrically connected to the lead 4C via the wire 5J. One end of a wire 5M is joined to the pad portion 313, and the pad portion 313 is electrically connected to the lead 4I via the wire 5M. One end of a wire 5N is joined to the pad portion 314, and the pad portion 314 is electrically connected to the lead 4J via the wire 5N. One end of a wire 5F is joined to the pad portion 315, and the pad portion 315 is electrically connected to the gate electrode 13 (pad portion 131) of the semiconductor element 1 via the wire 5F. One end of a wire 5H is joined to the pad portion 316, and the pad portion 316 is electrically connected to the gate electrode 23 (pad portion 231) of the semiconductor element 2 via the wire 5H. One end of a wire 5K is joined to the pad portion 317, and the pad portion 317 is electrically connected to the lead 4G via the wire 5K. One end of a wire 5E is joined to the pad portion 318, and the pad portion 318 is electrically connected to the lead 4A via the wire 5E.

The two semiconductor elements 1 and 2 and the control element 3 are mounted on the lead frame 4. The lead frame 4 forms an electrical communication path together with the plurality of connection members 5 in the semiconductor device A1. The lead frame 4 is made of a conductive material. The constituent material of the lead frame 4 is a metal including Cu (copper), for example. It should be noted that the constituent material may also be a metal other than Cu. The surface of the lead frame 4 may be plated as appropriate. As shown in FIG. 2, the lead frame 4 includes the plurality of leads 4A to 4J that are spaced apart from one another. Portions of the leads 4A to 4J are exposed from the sealing member 6. These exposed portions serve as terminals at the time of installing the semiconductor device A1 on an external circuit board.

The semiconductor element 1 is mounted on the lead 4A. One end of each of the plurality of wires 5B is joined to the lead 4A, and the lead 4A is electrically connected to the source electrode 12 of the semiconductor element 1 via the wires 5B. One end of each of the plurality of wires 5C is joined to the lead 4A, and the lead 4A is electrically connected to the drain electrode 21 of the semiconductor element 2 via the wires 5C. Furthermore, one end of the wire 5E is joined to the lead 4A, and the lead 4A is electrically connected to the element electrode 31 (pad portion 318) of the control element 3 via the wire 5E. The semiconductor element 2 is mounted on the lead 4B. One end of each of the plurality of wires 5D is joined to the lead 4B, and the lead 4B is electrically connected to the source electrode 22 of the semiconductor element 2 via the wires 5D. The control element 3 is mounted on the lead 4C. One end of the wire 5J is joined to the lead 4C, and the lead 4C is electrically connected to the element electrode 31 (pad portion 312) of the control element 3 via the wire 5J. One end of each of the plurality of wires 5A is joined to the lead 4D, and the lead 4D is electrically connected to the drain electrode 11 of the semiconductor element 1 via the wires 5A. One end of the wire 5G is joined to the lead 4E, and the lead 4E is electrically connected to the gate electrode 13 (pad portion 132) of the semiconductor element 1 via the wire 5G. One end of the wire 5I is joined to the lead 4F, and the lead 4F is electrically connected to the gate electrode 23 (pad portion 232) of the semiconductor element 2 via the wire 5I. One end of the wire 5K is joined to the lead 4G, and the lead 4G is electrically connected to the element electrode 31 (pad portion 317) of the control element 3 via the wire 5K. One end of the wire 5L is joined to the lead 4H, and the lead 4H is electrically connected to the element electrode 31 (pad portion 311) of the control element 3 via the wire 5L. One end of the wire 5M is joined to the lead 4I, and the lead 4I is electrically connected to the element electrode 31 (pad portion 313) of the control element 3 via the wire 5M. One end of the wire 5N is joined to the lead 4J, and the lead 4J is electrically connected to the element electrode 31 (pad portion 314) of the control element 3 via the wire 5N.

As shown in FIGS. 2 and 4, the lead 4A includes a die pad portion 411 and a bonding portion 412. The die pad portion 411 and the bonding portion 412 are formed in one piece, in other words, formed integral with each other. It should be noted that the die pad portion 411 and the bonding portion 412 may also be separate from each other.

The die pad portion 411 is a portion on which the semiconductor element 1 is mounted. The semiconductor element 1 is joined to the die pad portion 411 via a joining material (not shown). The die pad portion 411 is opposed to the element reverse surface 1b. The die pad portion 411 corresponds to the "first die pad portion" recited in the claims.

The bonding portion 412 is a portion to which some of the plurality of connection members 5 are joined. In this embodiment, one end of each of the plurality of wires 5B, the plurality of wires 5C and the wire 5E is joined to the bonding portion 412. The bonding portion 412 is electrically connected to the source electrode 12 of the semiconductor element 1 via the plurality of wires 5B, and is electrically connected to the drain electrode 21 of the semiconductor element 2 via the plurality of wires 5C. In addition, the bonding portion 412 is electrically connected to the element electrode 31 (pad portion 318) of the control element 3 via the wire 5E. The bonding portion 412 is arranged between the semiconductor element 1 and the semiconductor element 2 in a plan view. The bonding portion 412 corresponds to the "first bonding portion" recited in the claims.

As shown in FIGS. 2 and 4, the lead 4B includes a die pad portion 421 and a bonding portion 422. The die pad portion 421 and the bonding portion 422 are formed in one piece. It should be noted that the die pad portion 421 and the bonding portion 422 may also be separate from each other.

The die pad portion 421 is a portion on which the semiconductor element 2 is mounted. The semiconductor element 2 is joined to the die pad portion 421 via a joining material (not shown). The die pad portion 421 is opposed to the element reverse surface 2b. The die pad portion 421 corresponds to the "second die pad portion" recited in the claims.

The bonding portion 422 is a portion to which some of the plurality of connection members 5 are joined. In this embodiment, one end of each of the plurality of wires 5D is joined to the bonding portion 422. The bonding portion 422 is electrically connected to the source electrode 22 of the semiconductor element 2 via the plurality of wires 5D. The bonding portion 422 corresponds to the "second bonding portion" recited in the claims.

As shown in FIG. 2, both the lead 4A and the lead 4B are arranged on the y2 side with respect to the lead 4C. Both the lead 4A and the lead 4B overlap with the lead 4C as viewed in the y direction, and do not overlap with the lead 4C as viewed in the x direction. The lead 4A and the lead 4B are adjacent to each other in the x direction. The lead 4A and the lead 4B overlap with each other as viewed in the x direction.

The lead 4E and the lead 4F overlap with each other as viewed in the x direction. As shown in FIG. 2, the lead 4E is arranged near the pad portion 132 in a plan view, and is closer to the pad portion 132 than the other leads (excluding the lead 4A) are. As shown in FIG. 2, the lead 4F is arranged near the pad portion 232 in a plan view, and is closer to the pad portion 232 than the other leads (excluding the lead 4B) are.

The lead 4D and the bonding portion 422 of the lead 4B overlap with each other as viewed in the x direction. The lead 4D, the lead 4A, and the lead 4B overlap with one another as viewed in the x direction, and are disposed side by side in the x direction. The lead 4D is electrically connected to the drain electrode 11 of the semiconductor element 1, the lead 4A is electrically connected to the source electrode 12 of the semiconductor element 1 and the drain electrode 21 of the semiconductor element 2, and the lead 4B is electrically connected to the source electrode of the semiconductor element 2. Accordingly, the electrical current path from the lead 4D to the lead 4B via the two semiconductor elements 1 and 2 is formed extending in the x direction.

The lead 4E, the lead 4D, the lead 4G, and the lead 4H overlap with one another as viewed in the y direction, and are disposed side by side in the y direction. The lead 4F, the bonding portion 422 of the lead 4B, the lead 4I, and the lead 4J overlap with one another as viewed in the y direction, and are disposed side by side in the y direction.

The lead 4G, the lead 4H, the lead 4I, and the lead 4J overlap with the lead 4C as viewed in the x direction. The two leads 4G and 4H are arranged on the x1 side with respect to the lead 4C, and the two leads 4I and 4J are arranged on the x2 side with respect to the lead 4C. The lead 4G and the lead 4I overlap with each other as viewed in the x direction. The lead 4H and the lead 4J overlap with each other as viewed in the x direction.

As shown in FIGS. 3 to 6, each of the leads 4A to 4J is provided with a recessed portion 49. In each of the leads 4A to 4J, the recessed portion 49 is a portion that is recessed toward the z2 side from the surface facing the z1 side. As shown in FIG. 3, in each of the leads 4A to 4J, the recessed portion 49 is formed along the outer peripheral edge in a plan view. The recessed portions 49 are covered by the sealing member 6. In the example shown in FIGS. 4 to 6, the wall surfaces of the recessed portions 49 are curved, but do not need to be curved. The recessed portions 49 are formed to prevent dislodgement of the leads 4A to 4J.

In this embodiment, the lead 4A corresponds to the "first lead" recited in the claims. The lead 4B corresponds to the "second lead" recited in the claims. The lead 4C corresponds to the "third lead" recited in the claims. The lead 4D corresponds to the "fourth lead" recited in the claims. The lead 4E corresponds to the "fifth lead" recited in the claims. The lead 4F corresponds to the "sixth lead" recited in the claims. The leads 4G to 4J correspond to the "seventh leads" recited in the claims.

Each of the plurality of connection members 5 enables electrical communication between two members that are spaced apart. Each of the connection members 5 is made of a conductive material. As shown in FIG. 2, the plurality of connection members 5 include the plurality of wires 5A to 5N. The wires 5A to 5N are so-called bonding wires. The constituent material of the wires 5A to 5N may be any of a metal including Au (gold), a metal including Al (aluminum), and a metal including Cu, for example.

As shown in FIG. 2, one end of each of the plurality of wires 5A is joined to the pad portion 111 of the drain electrode 11 of the semiconductor element 1, and the other end thereof is joined to the lead 4D. One end of each of the plurality of wires 5B is joined to the pad portion 121 of the source electrode 12 of the semiconductor element 1, and the other end thereof is joined to the bonding portion 412 of the lead 4A. One end of each of the plurality of wires 5C is joined to the pad portion 211 of the drain electrode 21 of the semiconductor element 2, and the other end thereof is joined to the bonding portion 412 of the lead 4A. One end of each of the plurality of wires 5D is joined to the pad portion 221 of the source electrode 22 of the semiconductor element 2, and the other end thereof is joined to the bonding portion 422 of the lead 4B. One end of the wire 5E is joined to the pad portion 318 of the element electrode 31 of the control element 3, and the other end thereof is joined to the bonding portion 412 of the lead 4A. One end of the wire 5F is joined to the pad portion 315 of the element electrode 31 of the control element 3, and the other end thereof is joined to the pad portion 131 of the gate electrode 13 of the semiconductor element 1. One end of the wire 5G is joined to the lead 4E, and the other end thereof is joined to the pad portion 132 of the gate electrode 13 of the semiconductor element 1. One end of the wire 5H is joined to the pad portion 316 of the element electrode 31 of the control element 3, and the other end thereof is joined to the pad portion 231 of the gate electrode 23 of the semiconductor element 2. One end of the wire 5I is joined to the lead 4F, and the other end thereof is joined to the pad portion 232 of the gate electrode 23 of the semiconductor element 2. One end of the wire 5J is joined to the pad portion 312 of the element electrode 31 of the control element 3, and the other end thereof is joined to the lead 4C. One end of the wire 5K is joined to the pad portion 317 of the element electrode 31 of the control element 3, and the other end thereof is joined to the lead 4G. One end of the wire 5L is joined to the pad portion 311 of the element electrode 31 of the control element 3, and the other end thereof is joined to the lead 4H. One end of the wire 5M is joined to the pad portion 313 of the element electrode 31 of the control element 3, and the other end thereof is joined to the lead 4I. One end of the wire 5N is joined to the pad portion 314 of the element electrode 31 of the control element 3, and the other end thereof is joined to the lead 4J.

In the example shown in FIG. 2, three wires 5A are joined to each of the three pad portions 111. Three wires 5B are joined to each of the two pad portions 121. Similarly, three wires 5C are joined to each of the three pad portions 211. Three wires 5D are joined to each of the two pad portions 221. Furthermore, the portion of the wire 5E that is joined to the bonding portion 412 is located between the portions of the wires 5B that are joined to the bonding portions 412 and the portions of the wires 5C that are joined to the bonding portion 412, in the x direction. It should be noted that the numbers of the wires 5A to 5N are not limited to the numbers shown in FIG. 2, and may be changed as appropriate in consideration of the areas of the pad portions 111, 121, 131, 132, 211, 221, 231, 232, and 311 to 318 in a plan view, the diameters of the wires 5A to 5N, the amounts of electrical current flowing through the wires 5A to 5N, and the like.

In this embodiment, the wires 5A correspond to the "first connection member" recited in the claims. The wires 5B correspond to the "second connection member" recited in the claims. The wires 5C correspond to the "third connection member" recited in the claims. The wires 5D correspond to the "fourth connection member" recited in the claims. The wire 5E corresponds to the "fifth connection member" recited in the claims. The wire 5F corresponds to the "sixth connection member" recited in the claims. The wire 5G corresponds to the "seventh connection member" recited in the claims. The wire 5H corresponds to the "eighth connection member" recited in the claims. The wire 5I corresponds to the "ninth connection member" recited in the claims. The wires 5K to 5N correspond to the "tenth connection members" recited in the claims.

The sealing member 6 is a member for protecting the semiconductor elements 1 and 2 and the control element 3. The sealing member 6 covers the semiconductor elements 1 and 2, the control element 3, a portion of the lead frame 4, and the plurality of connection members 5. The constituent material of the sealing member 6 is an electrical insulating resin material such as an epoxy resin. The sealing member 6 has a rectangular shape in a plan view, for example. It should be noted that the shape of the sealing member 6 is not limited to that of the example shown in FIGS. 1 to 6. The sealing member 6 includes a resin obverse surface 61, a resin reverse surface 62, and a plurality of resin side surfaces 631 to 634.

As shown in FIGS. 4 to 6, the resin obverse surface 61 and the resin reverse surface 62 are spaced apart in the z direction. The resin obverse surface 61 faces the z2 side, and the resin reverse surface 62 faces the z1 side. Portions of the leads 4A to 4J (surfaces facing the z1 side) are exposed from the resin reverse surface 62. The plurality of resin side surfaces 631 to 634 are sandwiched between the resin obverse surface 61 and the resin reverse surface 62 in the z direction and are connected to both of them. The resin side surfaces 631 and 632 are spaced apart in the x direction, and the resin side surface 631 faces the x1 side and the resin side surface 632 faces the x2 side. The resin side surfaces 633 and 634 are spaced apart in the y direction, and the resin side surface 633 faces the y1 side and the resin side surface 634 faces the y2 side.

Next, the circuit configuration of the semiconductor device A1 according to the first embodiment will be described with reference to FIG. 7. It should be noted that the reference electrical potential may be referred to as the "ground voltage $V_{GND}$" in the following description.

Figure 7:
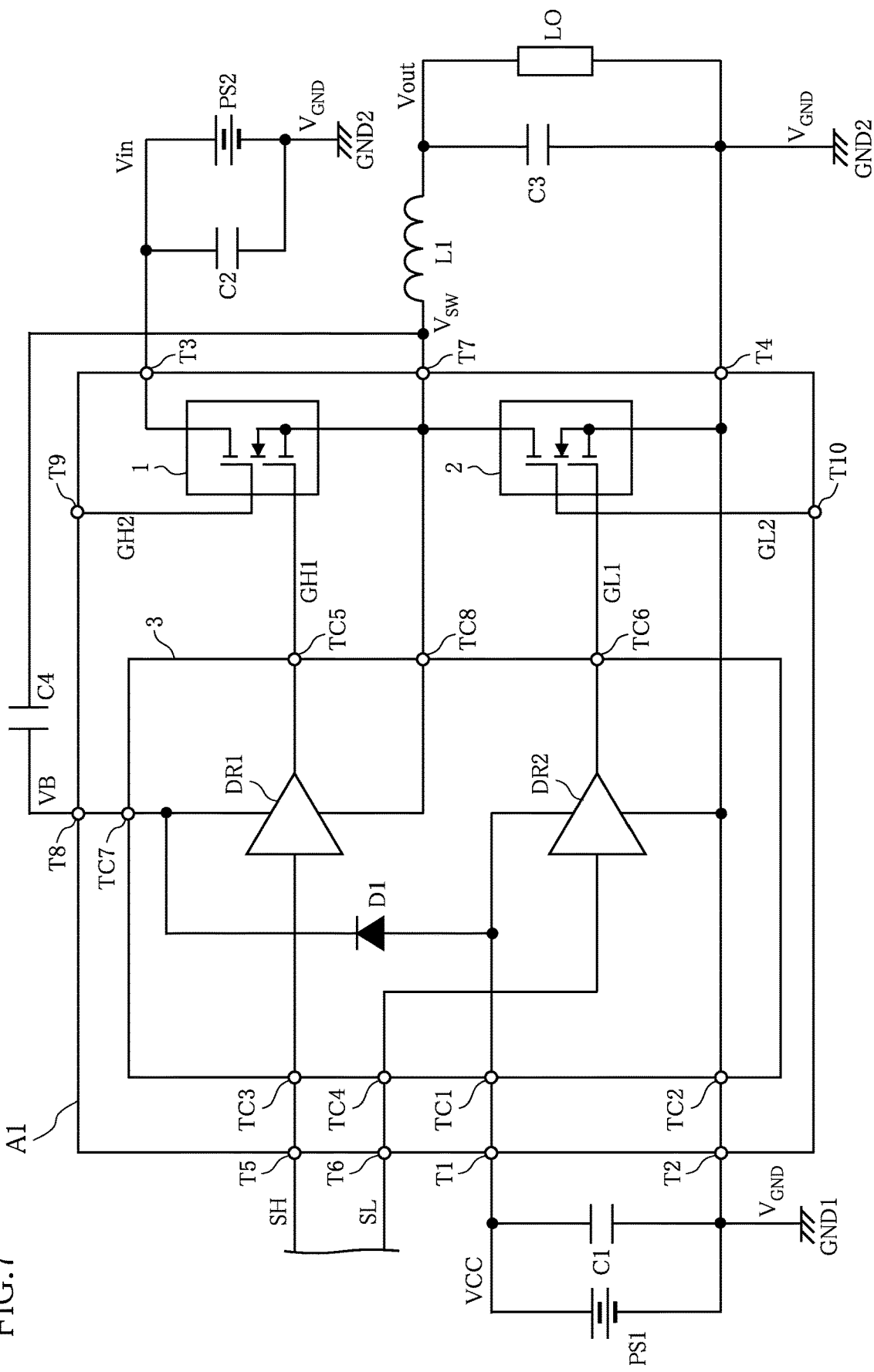
FIG. 7 is a circuit configuration diagram showing the semiconductor elements according to the first embodiment.

FIG. 7 shows a circuit diagram in a case where the semiconductor device A1 is applied to a synchronous rectification-type step-down DC/DC converter. The DC/DC converter is a power circuit that steps down an input voltage Vin and generates a desired output voltage Vout. The output voltage Vout is supplied to a load L0. It should be noted that the circuit diagram shown in FIG. 7 is merely an example.

As shown in FIG. 7, the circuit configuration of the semiconductor device A1 includes a plurality of external terminals T1 to T10, two semiconductor elements 1 and 2, and a control element 3. In addition, as shown in FIG. 7, two external power sources PS1 and PS2 and a plurality of discrete components (a plurality of capacitors C1 to C4 and an inductor L1) are connected to the semiconductor device A1. It should be noted that one or more of the plurality of discrete components may be built into the semiconductor device A1.

The external power source PS1 generates a power source voltage VCC for driving the control element 3. The high-potential side terminal of the external power source PS1 is connected to the external terminal T1. The low-potential side terminal of the external power source PS1 is connected to a first ground end GND1, and is grounded at a reference electrical potential. The capacitor C1 is connected to the external power source PS1 in parallel. The capacitor C1 is a bypass capacitor that stabilizes the power source voltage VCC.

The external power source PS2 generates an input voltage Vin. The high-potential side terminal of the external power source PS2 is connected to the external terminal T3. The low-potential side terminal of the external power source PS2 is connected to a second ground end GND2, and is grounded at a reference electrical potential. It should be noted that a case where both the first ground end GND1 and the second ground end GND2 are ground ends at a reference electrical potential is shown, but the reference electrical potential of the first ground end GND1 and the reference electrical potential of the second ground end GND2 may be different from each other. The capacitor C2 is connected to the external power source PS2 in parallel. The capacitor C2 is a bypass capacitor that stabilizes the input voltage Vin.

A first end of the inductor L1 is connected to the external terminal T7, and a second end thereof is connected to the load L0 and the capacitor C3. A first end of the capacitor C3 is connected to the inductor L1, and a second end thereof is connected to the second ground end GND2. The inductor L1 and the capacitor C3 form an LC filter circuit. A first end of the capacitor C4 is connected to the external terminal T7, and a second end thereof is connected to the external terminal T8. The capacitor C4 forms a bootstrap circuit together with a diode D1, which will be described later. The capacitor C4 generates a boot voltage VB.

The external terminal T1 is an input end to which the power source voltage VCC is input. The external terminal T1 is connected to the high-potential side terminal of the external power source PS1. The external terminal T1 is connected to the control element 3 (a connection terminal TC1, which will be described later) inside the semiconductor device A1. The external terminal T1 corresponds to the lead 4H in the module structure of the semiconductor device A1, for example.

The external terminal T2 is connected to the first ground end GND1, and is grounded at a reference electrical potential. The external terminal T2 is connected to the control element 3 (a connection terminal TC2, which will be described later) inside the semiconductor device A1. The external terminal T2 corresponds to the lead 4C in the module structure of the semiconductor device A1, for example.

The external terminal T3 is an input end to which the input voltage Vin is input. The external terminal T3 is connected to the high-potential side terminal of the external power source PS2. The external terminal T3 is connected to a drain of the semiconductor element 1 inside the semiconductor device A1. The external terminal T3 corresponds to the lead 4D in the module structure of the semiconductor device A1, for example.

The external terminal T4 is connected to the second ground end GND2, and is grounded at a reference electrical potential. The external terminal T4 is connected to a source of the semiconductor element 2 inside the semiconductor device A1. The external terminal T4 corresponds to the lead 4B in the module structure of the semiconductor device A1, for example.

The external terminal T5 is an input end to which a control signal SH is input. The control signal SH is a signal for controlling the switching operations performed by the semiconductor element 1. The control signal SH is a rectangular pulse wave in which a high level and a low level are alternately switched, for example. The external terminal T5 is connected to the control element 3 (a connection terminal TC3, which will be described later) inside the semiconductor device A1. The external terminal T5 corresponds to the lead 4I in the module structure of the semiconductor device A1, for example.

The external terminal T6 is an input end to which a control signal SL is input. The control signal SL is a signal for controlling the switching operation performed by the semiconductor element 2. The control signal SL is a rectangular pulse wave in which a high level and a low level are alternately switched, for example. The high-level period and the low-level period are inverted between the control signal SL and the control signal SH. The external terminal T6 is connected to the control element 3 (a connection terminal TC4, which will be described later) inside the semiconductor device A1. The external terminal T6 corresponds to the lead 4J in the module structure of the semiconductor device A1, for example.

The external terminal T7 is an output end from which an output voltage $V_{SW}$ is output. The output voltage $V_{SW}$ is a voltage signal generated through the switching operations performed by the semiconductor element 1 and the semiconductor element 2. The external terminal T7 is connected to the connection point where the source of the semiconductor element 1 and the drain of the semiconductor element 2 are connected to each other inside the semiconductor device A1. The external terminal T7 corresponds to the lead 4A in the module structure of the semiconductor device A1, for example.

The external terminal T8 is an input end to which the boot voltage VB is input. The boot voltage VB is a voltage signal generated by the capacitor C4 and a diode D1, which will be described later. The second end of the capacitor C4 is connected to the external terminal T8. The external terminal T8 is connected to the control element 3 (a connection terminal TC7, which will be described later) inside the semiconductor device A1. The external terminal T8 corresponds to the lead 4G in the module structure of the semiconductor device A1, for example.

The external terminal T9 is an input end to which a driving signal GH2 is input. The driving signal GH2 is a signal for driving the semiconductor element 1, and is input directly from an external device (not shown). The driving signal GH2 is a rectangular pulse wave in which a high level and a low level are alternately switched, for example. The external terminal T9 is connected to the gate of the semiconductor element 1 inside the semiconductor device A1. The external terminal T9 corresponds to the lead 4E in the module structure of the semiconductor device A1, for example.

The external terminal T10 is an input end to which a driving signal GL2 is input. The driving signal GL2 is a signal for driving the semiconductor element 2, and is input directly from an external device (not shown). The driving signal GL2 is a rectangular pulse wave in which a high level and a low level are alternately switched, for example. The high-level period and the low-level period are inverted between the driving signal GH2 and the driving signal GL2. The external terminal T10 is connected to the gate of the semiconductor element 2 inside the semiconductor device A1. The external terminal T10 corresponds to the lead 4F in the module structure of the semiconductor device A1, for example.

It should be noted that the correspondence relationships between the external terminals T1 to T10 in the circuit configuration and the leads 4A to 4J in the module structure are not limited to those as described above. For example, the combinations in the correspondence relationships between the external terminals T1, T5, T6, and T8 and the leads 4G to 4J can be changed as appropriate. It is sufficient that the combinations in the correspondence relationships are changed as appropriate in accordance with the arrangement of the pad portions 311, 313, 314, and 317 of the control element 3 in a plan view.

The two semiconductor elements 1 and 2 are formed of an n-type MOSFET as described above. In the semiconductor elements 1 and 2, the electrical communication state (on state) and the blocked state (off state) are switched in accordance with driving signals GH1, GH2, GL1, and GL2 input to the gates. The two semiconductor elements 1 and 2 form a half-bridge switching circuit, and the semiconductor element 1 is an upper arm of the switching circuit and the semiconductor element 2 is a lower arm of the switching circuit.

The drain of the semiconductor element 1 is connected to the external terminal T3, and the source of the semiconductor element 1 is connected to the drain of the semiconductor element 2. The gate of the semiconductor element 1 is connected to the control element 3 (a connection terminal TC5, which will be described later) and the external terminal T9.

When a driving signal GH1 is input to the gate from the control element 3, the semiconductor element 1 performs a switching operation in accordance with the driving signal GH1. When a high-level driving signal GH1 is input to the gate, the semiconductor element 1 enters the electrical communication state, and when a low-level driving signal GH1 is input to the gate, the semiconductor element 1 enters the blocked state. In addition, when a driving signal GH2 is input to the gate from the external terminal T9, the semiconductor element 1 performs a switching operation in accordance with the driving signal GH2. When a high-level driving signal GH2 is input to the gate, the semiconductor element 1 enters the electrical communication state, and when a low-level driving signal GH2 is input to the gate, the semiconductor element 1 enters the blocked state. It should be noted that the semiconductor element 1 is of a normally off type, but may also be of a normally on type. Moreover, one or both of the two driving signals GH1 and GH2 may be input to the gate of the semiconductor element 1.

The drain of the semiconductor element 2 is connected to the source of the semiconductor element 1, and the source of the semiconductor element 2 is connected to the external terminal T4. The gate of the semiconductor element 2 is connected to the control element 3 (a connection terminal TC6, which will be described later) and the external terminal T10.

When a driving signal GL1 is input to the gate from the control element 3, the semiconductor element 2 performs a switching operation in accordance with the driving signal GL1. When a high-level driving signal GL1 is input to the gate, the semiconductor element 2 enters the electrical communication state, and when a low-level driving signal GL1 is input to the gate, the semiconductor element 2 enters the blocked state. In addition, when a driving signal GL2 is input to the gate from the external terminal T10, the semiconductor element 2 performs a switching operation in accordance with the driving signal GL2. When a high-level driving signal GL2 is input to the gate, the semiconductor element 2 enters the electrical communication state, and when a low-level driving signal GL2 is input to the gate, the semiconductor element 2 enters the blocked state. It should be noted that the semiconductor element 2 is of a normally off type, but may also be of a normally on type. Moreover, one or both of the two driving signals GL1 and GL2 may be input to the gate of the semiconductor element 2.

The connection point where the source of the semiconductor element 1 and the drain of the semiconductor element 2 are connected to each other is connected to the external terminal T7 and the control element 3 (a connection terminal TC8, which will be described later). The output voltage $V_{SW}$ is applied to the external terminal T7 due to the switching operation performed by the semiconductor element 1 and the switching operation performed by the semiconductor element 2.

The control element 3 mainly controls the switching operations performed by the two semiconductor elements 1 and 2. The control element 3 generates the driving signals GH1 and GL1 based on the control signals SH and SL, and inputs the generated driving signals GH1 and GL1 to the semiconductor elements 1 and 2. The internal circuit of the control element 3 includes a plurality of connection terminals TC1 to TC8, two driving circuits DR1 and DR2, and a diode D1. The control element 3 is an IC obtained by integrating the two driving circuits DR1 and DR2 and the diode D1 in one chip.

The connection terminal TC1 is connected to the external terminal T1, and serves as an input end to which the power source voltage VCC is input in the control element 3. The connection terminal TC2 is connected to the external terminal T2, and is ground at a reference electrical potential. The connection terminal TC3 is connected to the external terminal T5, and serves as an input end to which the control signal SH is input in the control element 3. The connection terminal TC4 is connected to the external terminal T6, and serves as an input end to which the control signal SL is input in the control element 3. The connection terminal TC5 serves as an output end from which the driving signal GH1 is output. The connection terminal TC5 is connected to the gate of the semiconductor element 1. The connection terminal TC6 serves as an output end from which the driving signal GL1 is output. The connection terminal TC6 is connected to the gate of the semiconductor element 2. The connection terminal TC7 is connected to the external terminal T8, and serves as an input end to which the boot voltage VB is input in the control element 3. The connection terminal TC8 is connected to the connection point where the semiconductor element 1 (source) and the semiconductor element 2 (drain) are connected to each other.

The driving circuit DR1 generates the driving signal GH1 based on the input control signal SH. The driving signal GH1 is a signal for allowing the semiconductor element 1 to perform a switching operation, and is obtained by increasing the strength of the control signal SH to a level necessary for the semiconductor element 1 to perform the switching operation. The driving circuit DR1 outputs the generated driving signal GH1 from the connection terminal TC5. Since the connection terminal TC5 is connected to the gate of the semiconductor element 1, the driving signal GH1 is input to the gate of the semiconductor element 1. The driving signal GH1 is a signal for setting the boot voltage VB to a high level and the source voltage of the semiconductor element 1 to a low level. The source voltage of the semiconductor element 1 is input to the driving circuit DR1 via the connection terminal TC8. The gate voltage of the semiconductor element 1 is applied on the basis of the source voltage of the semiconductor element 1.

The driving circuit DR2 generates the driving signal GL1 based on the input control signal SL. The driving signal GL1 is a signal for making the semiconductor element 2 perform a switching operation, and is obtained by increasing the strength of the control signal SL to a level necessary for the semiconductor element 2 to perform the switching operation. The driving circuit DR2 outputs the generated driving signal GL1 from the connection terminal TC6. Since the connection terminal TC6 is connected to the gate of the semiconductor element 2, the driving signal GL1 is input to the gate of the semiconductor element 2. The driving signal GL1 is a signal for setting the power source voltage VCC to a high level and the ground voltage $V_{GND}$ to a low level. The gate voltage of the semiconductor element 2 is applied on the basis of the ground voltage $V_{GND}$.

An anode of the diode D1 is connected to the connection terminal TC1, and the cathode thereof is connected to the connection terminal TC7. The diode D1 forms a bootstrap circuit together with the capacitor C4. The bootstrap circuit generates the boot voltage VB and supplies this boot voltage VB to the driving circuit DR1. It should be noted that the diode D1 may be arranged outside the control element 3.

Next, an operational example of the semiconductor device A1 will be described.

In the semiconductor device A1, the control element 3 generates the driving signals GH1 and GL1 when the control signals SH and SL are input to the control element 3 from the external terminals T5 and T6. Then, the driving signals GH1 and GL1 are respectively input to the gates of the semiconductor elements 1 and 2 from the control element 3. Alternatively, the driving signals GH2 and GL2 are respectively input to the gates of the semiconductor elements 1 and 2 from the external terminals T9 and T10. Thus, a first period in which the semiconductor element 1 is in the electrical communication state and the semiconductor element 2 is in the blocked state, and a second period in which the semiconductor element 1 is in the blocked state and the semiconductor element 2 is in the electrical communication state are alternately repeated. At this time, the input voltage Vin is applied to the external terminal T7 during the first period. On the other hand, the external terminal T7 is ground at a reference electrical potential (the ground voltage $V_{GND}$ is applied to the external terminal T7) during the second period. Accordingly, the output voltage $V_{SW}$ output from the external terminal T7 is a pulse wave in which the input voltage Vin corresponds to the high-level voltage and the ground voltage $V_{GND}$ corresponds to the low-level voltage. The output voltage $V_{SW}$ is smoothed by the inductor L1 and the capacitor 3 and thus converted to the output voltage Vout, which is a D.C. voltage. Due to the semiconductor device A1 operating as described above, the input voltage Vin is transformed (stepped down) to the output voltage Vout.

The first period and the second period are alternately repeated in a predetermined cycle, and the step-down ratio can be changed depending on the ratio between the first period and the second period in one cycle. For example, when the first period makes up 25% of one cycle (i.e., the second period makes up 75% of one cycle), the input voltage Vin is transformed by a factor of ¼ (Vout=Vin×(25/100)) to obtain the output voltage Vout. It should be noted that a dead time in which both the semiconductor elements 1 and 2 are in the blocked state may be provided between the first period and the second period.

Functions and effects of the semiconductor device A1 configured as described above are as follows.

With the first embodiment, the semiconductor device A1 includes the lead 4A, the lead 4B, and the lead 4C. The lead 4A and the lead 4B overlap with each other as viewed in the x direction, and the lead 4C overlaps with both the lead 4A and the lead 4B as viewed in the y direction. The semiconductor element 1 is mounted on the lead 4A, the semiconductor element 2 is mounted on the lead 4B, and the control element 3 is mounted on the lead 4C. Accordingly, the separation distance between the semiconductor element 1 and the semiconductor element 2 can be reduced compared with the semiconductor device disclosed in JP 2003-218309A. Specifically, in the semiconductor device disclosed in JP 2003-218309A, two semiconductor elements (switching elements) are arranged on sides opposite to each other with a control element (control IC) located therebetween in a plan view. Therefore, it is necessary to install wiring around the control element in order to connect the two semiconductor elements to each other, and thus the wiring distance tends to increase. On the other hand, in the semiconductor device A1, the control element 3 is not arranged between the semiconductor element 1 and the semiconductor element 2, and thus the length of wiring that connects the semiconductor element 1 and the semiconductor element 2 to each other (the lengths of the wires 5B and 5C, and a portion of the lead 4A in this embodiment) can be reduced. Accordingly, with the semiconductor device A1, a parasitic inductance and a parasitic resistance can be reduced, thus making it possible to improve the efficiency and reduce power consumption.

With the first embodiment, both the lead 4A and the lead 4B are arranged on the y2 side with respect to the lead 4C, and overlap with the lead 4C as viewed in the y direction. Accordingly, the lead 4A on which the semiconductor element 1 is mounted and the lead 4B on which the semiconductor element 2 is mounted can be arranged on one side (y2 side) in the y direction, and the lead 4C on which the control element 3 is mounted can be arranged on the other side (y1 side) in the y direction. When an electrical current is applied to the semiconductor device A1, the semiconductor elements 1 and 2 and the control element 3 generate heat. The amount of heat generated by the semiconductor elements 1 and 2 is larger than the amount of heat generated by the control element 3. If the heat generated by the semiconductor elements 1 and 2 is transferred to the control element 3, a malfunction and a decrease in performance may occur in the control element 3 due to the heat generated by the semiconductor elements 1 and 2. However, with the semiconductor device A1, the lead 4A and 4B are arranged on one side (y2 side) in the y direction with respect to the lead 4C, and thus the semiconductor elements 1 and 2 are arranged away from the control element 3. Accordingly, with the semiconductor device A1, the transfer of heat generated by the semiconductor elements 1 and 2 to the control element 3 is suppressed, thus making it possible to inhibit a malfunction and a decrease in performance from occurring in the control element 3.

With the first embodiment, the lead 4D, the lead 4A, and the lead 4B overlap with one another as viewed in the x direction, and are disposed side by side in the x direction. The pad portions 111, 121, 211, and 221 of the semiconductor elements 1 and 2 have a band shape extending in the x direction. Accordingly, with the semiconductor device A1, the electrical current path between the drain and the source of the semiconductor element 1 and the electrical current path between the drain and the source of the semiconductor element 2 (power system electrical current paths) can be linearly routed. These power system electrical current paths are electrical current paths used in power conversion performed in the semiconductor device A1. Particularly in the case where the semiconductor elements 1 and 2 are driven at a high frequency, the power system electrical current paths do not need to be bent at a right angle when routed, which is an effective measure against noise.

With the first embodiment, the lead 4A includes the die pad portion 411 and the bonding portion 412, which are formed in one piece. This makes it possible to diffuse heat generated by the semiconductor element 1 to not only the die pad portion 411 but also the bonding portion 412. Accordingly, with the semiconductor device A1, it is possible to suppress an increase in the junction temperature in the semiconductor element 1 caused by the heat generated by the semiconductor element 1. An increase in the junction temperature causes damage to the semiconductor element 1. In other words, with the semiconductor device A1, damage to the semiconductor element 1 can be suppressed. Similarly, the lead 4B includes the die pad portion 421 and the bonding portion 422, which are formed in one piece. This makes it possible to diffuse heat generated by the semiconductor element 2 to not only the die pad portion 421 but also the bonding portion 422. Accordingly, with the semiconductor device A1, it is possible to suppress an increase in the junction temperature in the semiconductor element 2 caused by the heat generated by the semiconductor element 2. In other words, with the semiconductor device A1, damage to the semiconductor element 2 can be suppressed.

With the first embodiment, the pad portion 131 of the gate electrode 13 of the semiconductor element 1 is arranged near the edge on the lead 4C side in the y direction on the element obverse surface 1a. This makes it possible to reduce the separation distance between the pad portion 131 and the control element 3 in the semiconductor device A1 in a plan view. Accordingly, the length of the wire 5F can be reduced, thus making it possible to reduce a parasitic inductance and a parasitic resistance in the wire 5F. In particular, the wire 5F is a wire for transmitting the driving signal GH1, and thus a reduction in switching operation responsiveness, and switching malfunctions can be suppressed in the semiconductor element 1. Similarly, the pad portion 231 of the gate electrode 23 of the semiconductor element 2 is arranged near the edge on the lead 4C side in the y direction on the element obverse surface 2a. This makes it possible to reduce the separation distance between the pad portion 231 and the control element 3 in the semiconductor device A1 in a plan view. Accordingly, the length of the wire 5H can be reduced, thus making it possible to reduce a parasitic inductance and a parasitic resistance in the wire 5H. In particular, the wire 5H is a wire for transmitting the driving signal GL1, and thus a reduction in switching operation responsiveness, and switching malfunctions can be suppressed in the semiconductor element 2.

With the first embodiment, the lead 4E is arranged near the pad portion 132 in a plan view, and is closer to the pad portion 132 than any other leads (excluding the lead 4A) are. Accordingly, the length of the wire 5G that connects the lead 4E and the pad portion 132 to each other can be reduced, thus making it possible to reduce a parasitic inductance and a parasitic resistance in the wire 5G. In particular, the wire 5G serves as a wire for transmitting the driving signal GH2 when the driving signal GH2 is input to the semiconductor device A1 from an external device, and thus a reduction in switching operation responsiveness, and switching malfunctions can be suppressed in the semiconductor element 1. Moreover, the lead 4F is arranged near the pad portion 232 in a plan view, and is closer to the pad portion 232 than any other leads (excluding the lead 4B) are. Accordingly, the length of the wire 5I that connects the lead 4F and the pad portion 232 to each other can be reduced, thus making it possible to reduce a parasitic inductance and a parasitic resistance in the wire 5I. In particular, the wire 5I serves as a wire for transmitting the driving signal GL2 when the driving signal GL2 is input to the semiconductor device A1 from an external device, and thus a reduction in switching operation responsiveness, and switching malfunctions can be suppressed in the semiconductor element 2.

Figure 8:
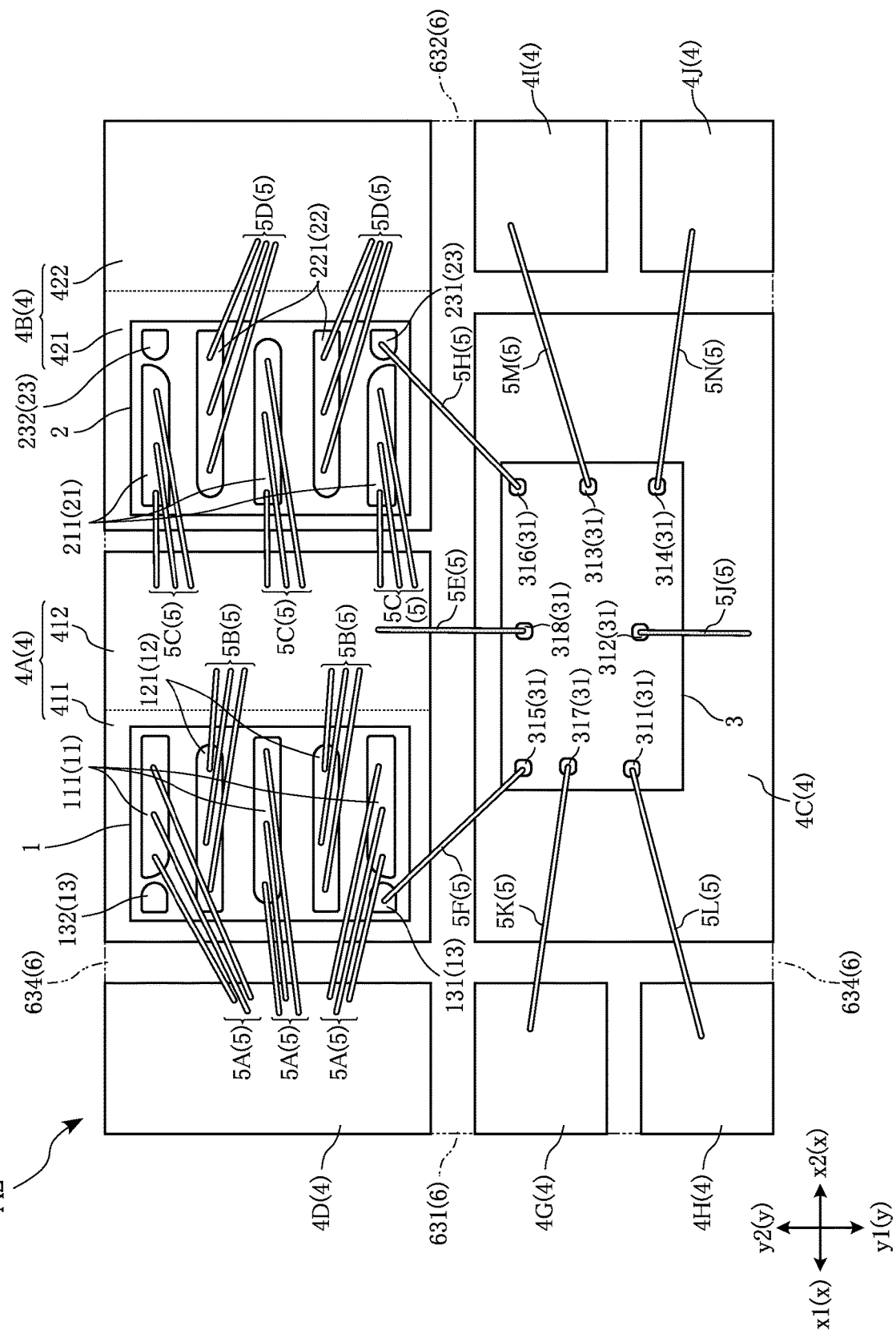
FIG. 8 is a plan view showing a semiconductor device according to a second embodiment.

Next, a semiconductor device A2 according to a second embodiment will be described with reference to FIG. 8. FIG. 8 is a plan view showing the semiconductor device A2, and the sealing member 6 is shown with an imaginary line (two-dot dash line).

As shown in FIG. 8, the semiconductor device A2 differs from the semiconductor device A1 in the configuration of the lead frame 4. Specifically, the lead frame 4 of the semiconductor device A2 does not include the leads 4E and 4F unlike the lead frame 4 of the semiconductor device A1.

As shown in FIG. 8, in the lead frame 4 of the semiconductor device A2, instead of arranging the lead 4E, the lead 4D is expanded to the arrangement position of the lead 4E. Similarly, as shown in FIG. 8, instead of arranging the lead 4F, the bonding portion 422 of the lead 4B is expanded to the arrangement position of the lead 4F. Since the leads 4E and 4F are not included, the plurality of connection members 5 do not include the wires 5G and 5I.

With the second embodiment, the semiconductor device A2 includes the lead 4A, the lead 4B, and the lead 4C as is the case with the semiconductor device A1. The lead 4A and the lead 4B overlap with each other as viewed in the x direction, and the lead 4C overlaps with both the lead 4A and the lead 4B as viewed in the y direction. Accordingly, with the semiconductor device A2, the length of wiring that connects the semiconductor element 1 and the semiconductor element 2 to each other (the lengths of the wires 5B and 5C, and a portion of the lead 4A in this embodiment) can be reduced as is the case with the semiconductor device A1. Accordingly, with the semiconductor device A2, a parasitic inductance and a parasitic resistance can be reduced, thus making it possible to improve the efficiency and reduce power consumption.

With the second embodiment, the lead 4D of the semiconductor device A2 is larger in size compared with the semiconductor device A1. Accordingly, the wiring resistance in the lead 4D can be reduced in the semiconductor device A2 compared with the semiconductor device A1. In particular, the lead 4D is a portion of the above-described power system electrical current path, and thus power loss in power conversion can be suppressed in the semiconductor device A2 compared with the semiconductor device A1. Similarly, the bonding portion 422 of the lead 4B of the semiconductor device A2 is larger in size compared with the semiconductor device A1. Accordingly, the wiring resistance in the lead 4B can be reduced in the semiconductor device A2 compared with the semiconductor device A1. In particular, the lead 4B is a portion of the above-described power system electrical current path, and thus power loss in power conversion can be suppressed in the semiconductor device A2 compared with the semiconductor device A1. Furthermore, the semiconductor element 2 is mounted on the lead 4B, and heat generated by the semiconductor element 2 is transferred to the lead 4B. Accordingly, the efficiency in diffusing the heat generated by the semiconductor element 2 can be improved due to the increase in the size of the lead 4B (bonding portion 422).

Figure 9:
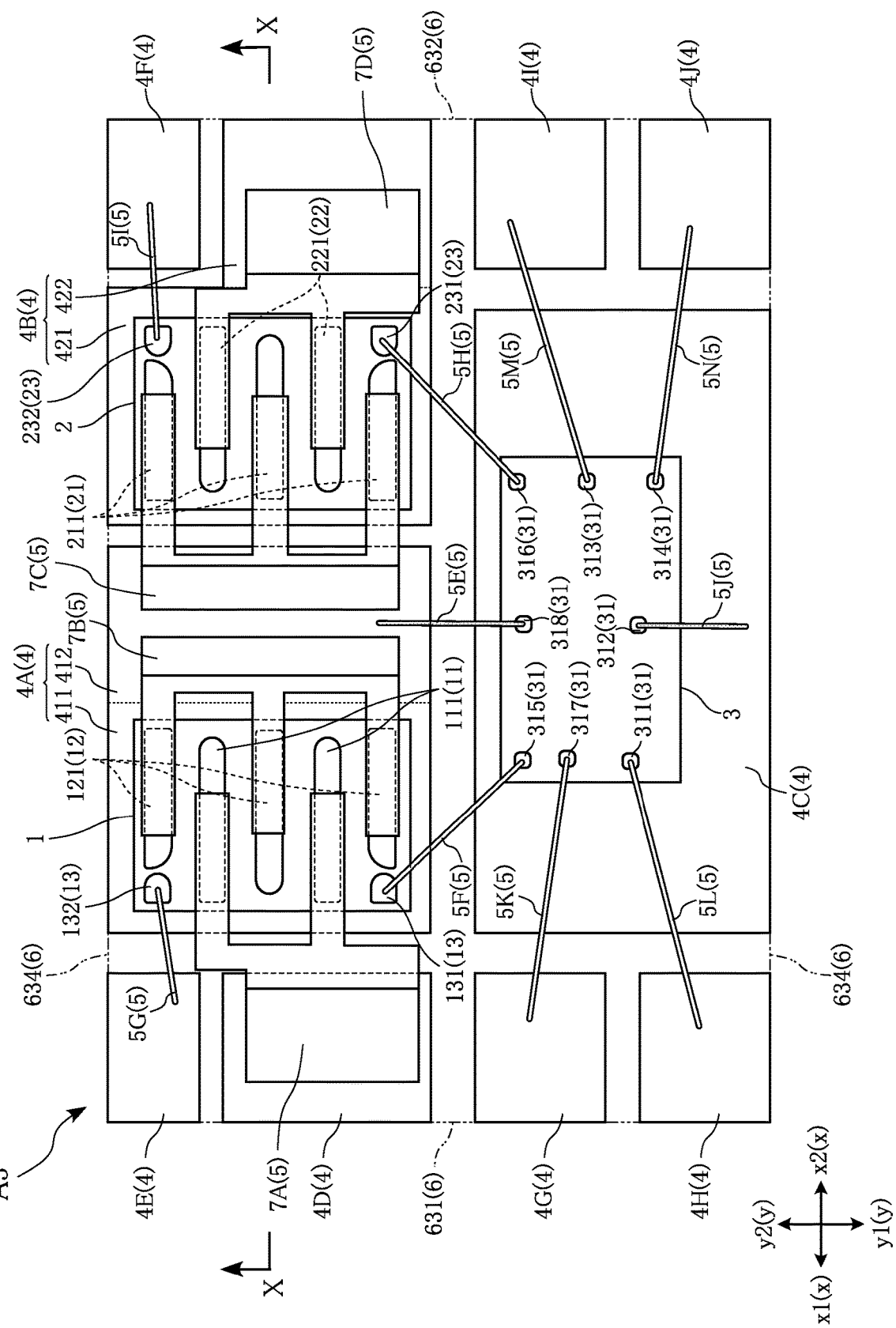
FIG. 9 is a plan view showing a semiconductor device according to a third embodiment.
Figure 10:
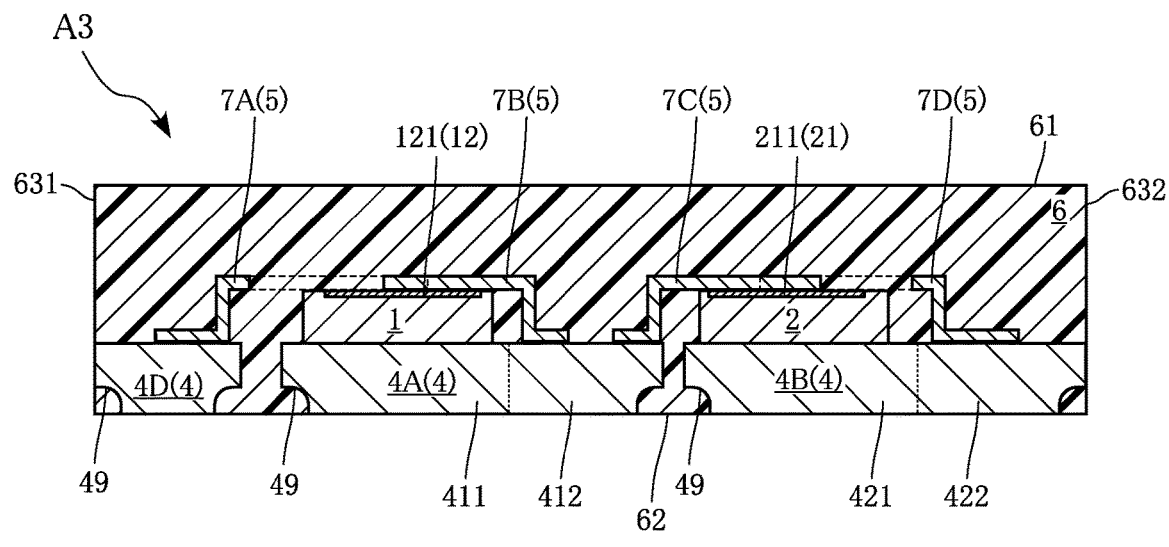
FIG. 10 is a cross-sectional view taken along line X-X in FIG. 9.

Next, a semiconductor device A3 according to a third embodiment will be described with reference to FIGS. 9 and 10. FIG. 9 is a plan view showing the semiconductor device A3, and the sealing member 6 is shown with an imaginary line (two-dot dash line). FIG. 10 is a cross-sectional view taken along line X-X in FIG. 9. It should be noted that, also in the semiconductor device A3, the lead frame 4 does not need to include the leads 4E and 4F as is the case with the second embodiment.

As shown in FIGS. 9 and 10, the semiconductor device A3 differs from the semiconductor device A1 in that the plurality of connection members 5 include clips 7A, 7B, 7C, and 7D instead of the wires 5A, 5B, 5C, and 5D. It should be noted that, in the semiconductor element 1 of the semiconductor device A3 shown in FIG. 9, the plurality of pad portions 111 (drain electrode 11) and the plurality of pad portions 121 (source electrode 12) have changed places with each other compared with the semiconductor device A1.

The clips 7A to 7D are obtained by bending plate-shaped metal members. The constituent material of the clips 7A to 7D is a metal including Cu, a metal including A1, or the like, for example. Alternatively, a clad material such as CIC (Copper-Invar-Copper) may also be used. It should be noted that, in the example shown in FIG. 10, the clips 7A to 7D are bent at a right angle to the upper faces of the leads 4A, 4B, and 4D, but may also be inclined to the z direction.

One side of the clip 7A in the x direction (x2 side in FIG. 9) has a comb-like shape, and the comb-like portion is joined to the plurality of pad portions 111. One side of the clip 7B in the x direction (x1 side in FIG. 9) has a comb-like shape, and the comb-like portion is joined to the plurality of pad portions 121. One side of the clip 7C in the x direction (x2 side in FIG. 9) has a comb-like shape, and the comb-like portion is joined to the plurality of pad portions 211. One side of the clip 7D in the x direction (x1 side in FIG. 9) has a comb-like shape, and the comb-like portion is joined to the plurality of pad portions 221. It should be noted that the shapes of the clips 7A to 7D are not limited to those of the example shown in FIG. 9.

With the third embodiment, the semiconductor device A3 includes the lead 4A, the lead 4B, and the lead 4C as is the case with the semiconductor device A1. The lead 4A and the lead 4B overlap with each other as viewed in the x direction, and the lead 4C overlaps with both the lead 4A and the lead 4B as viewed in the y direction. Accordingly, with the semiconductor device A3, the length of wiring that connects the semiconductor element 1 and the semiconductor element 2 to each other (the lengths of the clips 7B and 7C, and a portion of the lead 4A in this embodiment) can be reduced as is the case with the semiconductor device A1. Accordingly, with the semiconductor device A3, a parasitic inductance and a parasitic resistance can be reduced, thus making it possible to improve the efficiency and reduce power consumption.

With the third embodiment, the plurality of connection members 5 include the clip 7A instead of the wires 5A. The wiring resistance can be reduced in the case where the clip 7A is used compared with the case where the wires 5A are used. In particular, the clip 7A is a portion of the above-described power system electrical current path, and thus power loss in power conversion can be suppressed in the semiconductor device A3 compared with the semiconductor device A1. Similarly, the plurality of connection members 5 include the clips 7B, 7C, and 7D instead of the wires 5B, 5C, and 5D. The wiring resistance can be reduced in the case where the clips 7B, 7C, and 7D are used compared with the case where the wires 5B, 5C, and 5D are used. In particular, the clips 7B, 7C, and 7D are portions of the above-described power system electrical current path, and thus power loss in power conversion can be suppressed in the semiconductor device A3 compared with the semiconductor device A1.

Figure 11:
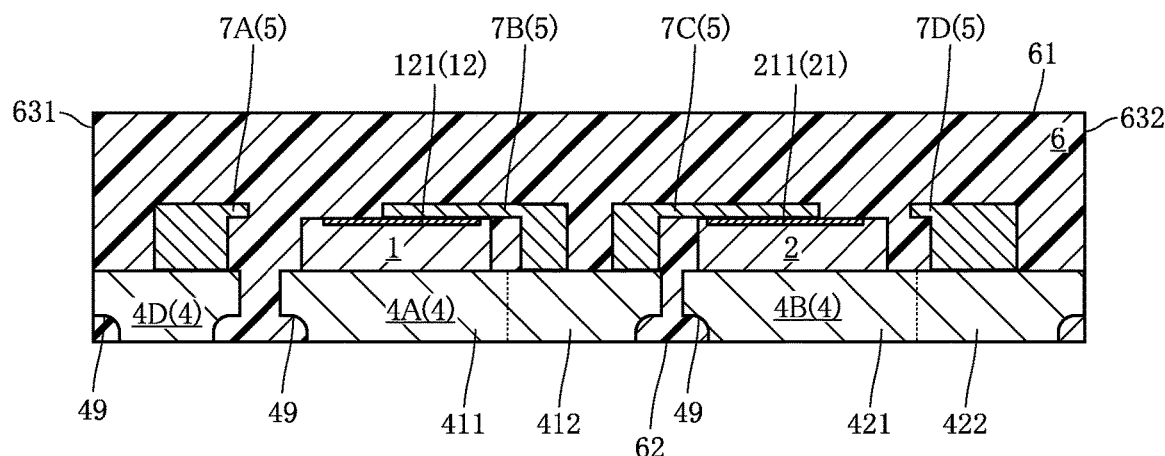
FIG. 11 is a cross-sectional view showing a semiconductor device according to a modified example of the third embodiment.

In the third embodiment, each of the clips 7A to 7D has a structure in which a portion thereof is bent, but there is no limitation to such a structure. For example, as shown in FIG. 11, each of the clips 7A to 7D may have a structure in which the thickness (the dimension in the z direction) of a portion thereof is changed. FIG. 11 is a cross-sectional view of a semiconductor device according to this modified example and shows a cross-section corresponding to the cross section shown in FIG. 10. For example, as shown in FIG. 11, in each of the clips 7A to 7D, portions joined to the semiconductor element 1 or semiconductor element 2 are thin, and portions joined to the lead 4A, 4B, or 4D are thick.

In the third embodiment, the clip 7A has a comb-like portion, and this comb-like portion is joined to the plurality of pad portions 111 (the drain electrode 11), but there is no limitation to this configuration. For example, a plurality of clips 7A that each have a band shape may be provided and be respectively joined to the plurality of pad portions 111. The same applies to the clips 7B to 7D.

Figure 12:
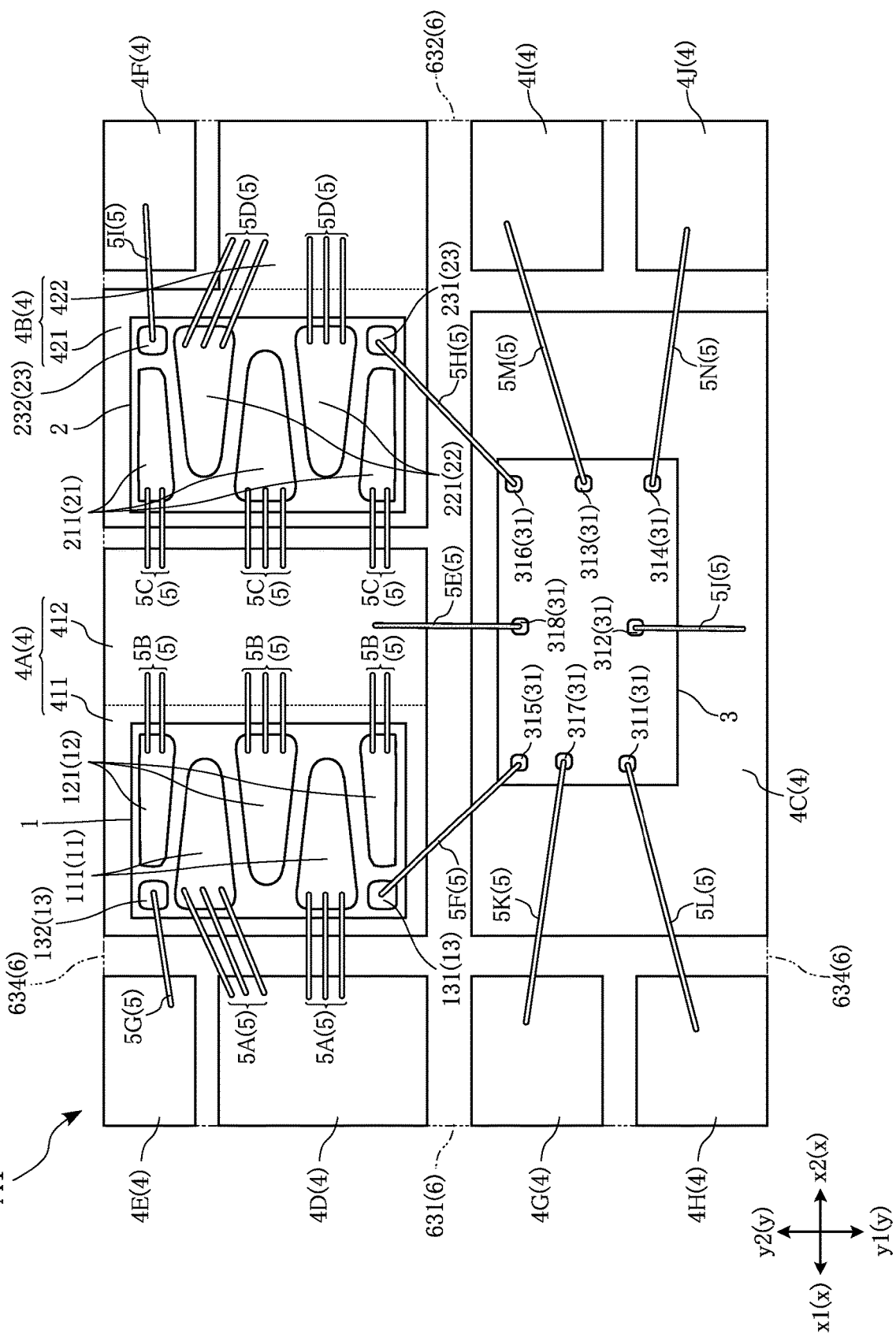
FIG. 12 is a plan view showing a semiconductor device according to a fourth embodiment.

Next, a semiconductor device A4 according to a fourth embodiment will be described with reference to FIG. 12. FIG. 12 is a plan view showing the semiconductor device A4, and the sealing member 6 is shown with an imaginary line (two-dot dash line). It should be noted that, also in the semiconductor device A4, the lead frame 4 does not need to include the leads 4E and 4F as is the case with the second embodiment. In addition, also in the semiconductor device A4, the clips 7A to 7D may be used instead of the wires 5A to 5D as is the case with the third embodiment.

As shown in FIG. 12, the semiconductor device A4 differs from the semiconductor device A1 in the configurations of the electrodes (the drain electrodes 11 and 21, and the source electrodes 12 and 22) of the semiconductor elements 1 and 2. Specifically, the shapes of the pad portions 111, 121, 211, and 221 in a plan view are changed.

The pad portions 111 of the semiconductor device A4 are tapered. Specifically, the dimensions in the y direction of the pad portions 111 decrease from the edge on the x1 side toward the edge on the x2 side in the x direction. The pad portions 111 have a substantially triangular shape in a plan view. Also, the pad portions 121, the pad portions 211, and the pad portions 221 are tapered. Specifically, the dimensions in the y direction of the pad portions 121 decrease from the edge on the x2 side toward the edge on the x1 side in the x direction. The dimensions in the y direction of the pad portions 211 decrease from the edge on the x1 side toward the edge on the x2 side in the x direction. The dimensions in the y direction of the pad portions 221 decrease from the edge on the x2 side toward the edge on the x1 side in the x direction. The pad portions 121, 211, and 221 have a substantially triangular shape in a plan view.

With the fourth embodiment, the semiconductor device A4 includes the lead 4A, the lead 4B, and the lead 4C as is the case with the semiconductor device A1. The lead 4A and the lead 4B overlap with each other as viewed in the x direction, and the lead 4C overlaps with both the lead 4A and the lead 4B as viewed in the y direction. Accordingly, with the semiconductor device A4, the length of wiring that connects the semiconductor element 1 and the semiconductor element 2 to each other (the lengths of the wires 5B and 5C, and a portion of the lead 4A in this embodiment) can be reduced as is the case with the semiconductor device A1. Accordingly, with the semiconductor device A4, a parasitic inductance and a parasitic resistance can be reduced, thus making it possible to improve the efficiency and reduce power consumption.

Figure 13:
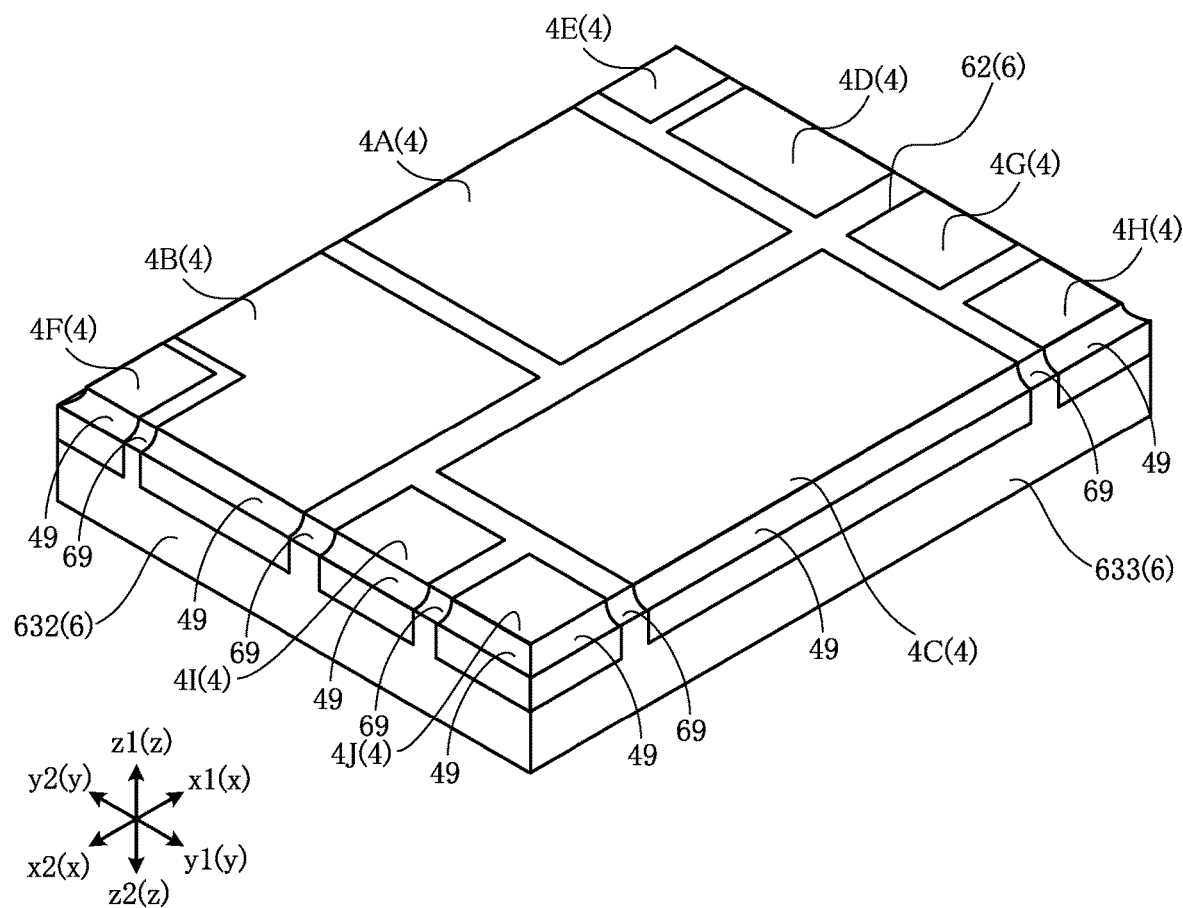
FIG. 13 is a perspective view showing a semiconductor device according to a modified example.

In the first embodiment to the fourth embodiment, each of the leads 4A to 4J is provided with the recessed portion 49 in the semiconductor devices A1 to A4, but there is no limitation to such configurations, and the recessed portions 49 do not need to be provided. Moreover, in the semiconductor devices A1 to A4, the recessed portion 49 is formed along the outer peripheral edge in each of the leads 4A to 4J in a plan view, but there is no limitation to such configurations. For example, as shown in FIG. 13, each of the leads 4A to 4J may be provided with a recessed portion 49 along an edge that is in contact with one of the resin side surfaces 631 to 634 in a plan view. FIG. 13 is a perspective view showing a semiconductor device according to this modified example as viewed from the bottom face side. In this case, the sealing member 6 is provided with recessed portions 69 along the outer peripheral edge in a plan view. The recessed portions 49 and the recessed portions 69 are continuous. Solder fillets are likely to be formed when the semiconductor device shown in FIG. 13 is installed on a circuit board of an electronic device or the like with solder. Accordingly, it is possible to increase the likelihood that the soldering state of the semiconductor device, which is a leadless package, can be visually confirmed.

Figure 14:
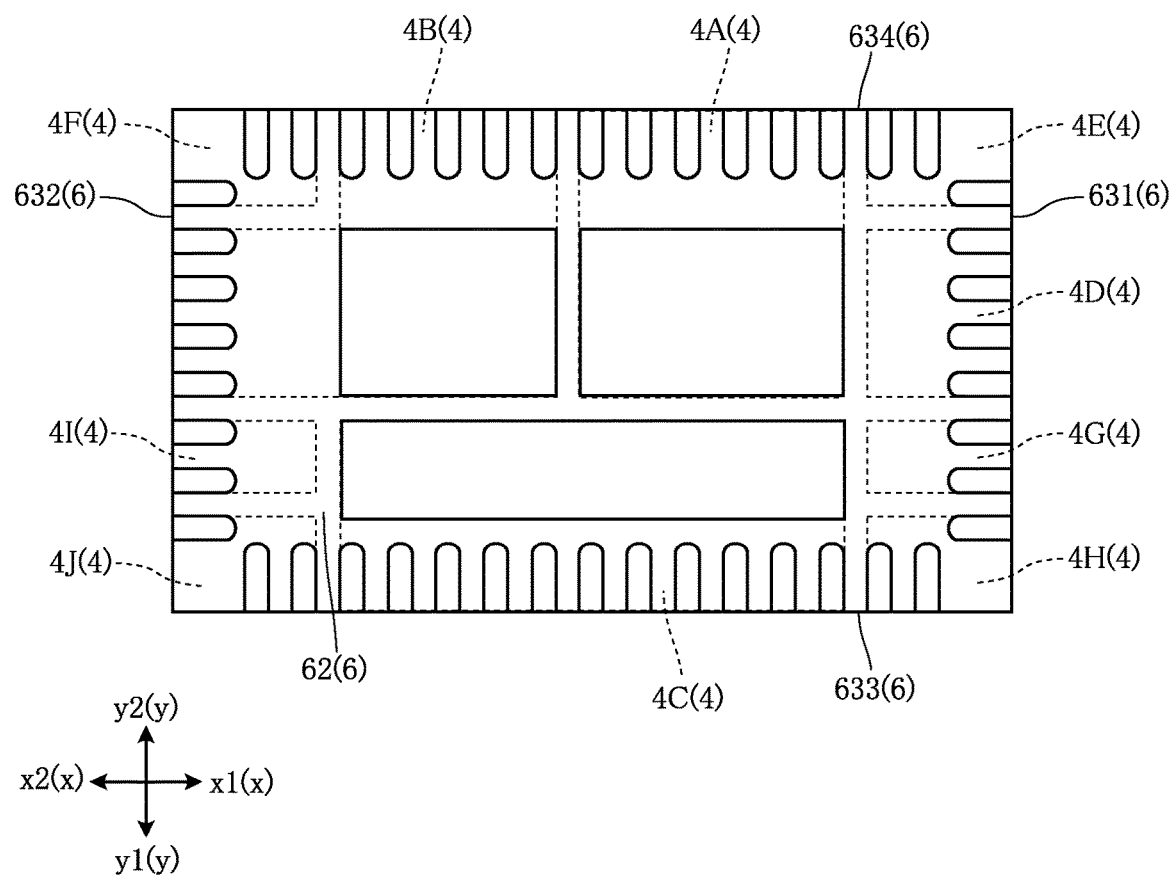
FIG. 14 is a bottom view showing a semiconductor device according to a modified example.

In the first embodiment to the fourth embodiment, the semiconductor devices A1 to A4 are of the SON package type, but there is no limitation to this type, and other package types may also be employed. For example, a BGA (Ball Grid Array) package type, an LGA (Land Grid Array) package type, a QFP (Quad Flat Package) package type, a QFN (Quad Flat Non-lead) package type, and the like may also be employed. It should be noted that these package types are merely examples, and there is no limitation thereto. For example, FIG. 14 shows a semiconductor device (bottom view) of a QFN package type.

The semiconductor device according to the present disclosure is not limited to the above-described embodiments. Various modifications in design may be made freely in the specific structure of each part of the semiconductor device according to the present disclosure.

The invention claimed is:

1. A semiconductor device comprising:
   a first semiconductor element including a first obverse surface and a first reverse surface that are spaced apart in a thickness direction, the first obverse surface being provided with a plurality of electrodes;
   a second semiconductor element including a second obverse surface and a second reverse surface that are spaced apart in the thickness direction, the second obverse surface being provided with a plurality of electrodes;
   a control element including a third obverse surface and a third reverse surface that are spaced apart in the thickness direction, the control element being configured to control the first semiconductor element and the second semiconductor element;
   a first conductive member facing the first reverse surface and supporting the first semiconductor element;
   a second conductive member facing the second reverse surface and supporting the second semiconductor element;
   a third conductive member facing the third reverse surface and supporting the control element; and
   a plurality of leads each spaced apart from the third conductive member, and aligned in a direction in which the first conductive member and the second conductive member are aligned,
   wherein the first conductive member and the second conductive member overlap with each other as viewed in a first direction perpendicular to the thickness direction,
   the third conductive member overlaps with the first conductive member and the second conductive member as viewed in a second direction perpendicular to the thickness direction and the first direction.

2. The semiconductor device according to claim 1, wherein each of the first semiconductor element and the second semiconductor element comprises a switching element.

3. The semiconductor device according to claim 1, further comprising a sealing resin that covers the first semiconductor element, the second semiconductor element and the third semiconductor element, while also covering at least partially the first conductive member, the second conductive member, the third conductive member and the plurality of leads.

4. The semiconductor device according to claim 3, wherein each of the first conductive member, the second conductive member and the third conductive member comprises a portion exposed from the sealing resin.

5. The semiconductor device according to claim 1, further comprising a connecting member that electrically connects one of the plurality of electrodes of the first semiconductor element to the first conductive member.

6. The semiconductor device according to claim 1, further comprising a connecting member that electrically connects one of the plurality of electrodes of the second semiconductor element to the first conductive member.

7. The semiconductor device according to claim 1, further comprising a connecting member that electrically connects one of the plurality of electrodes of the second semiconductor element to the second conductive member.

8. The semiconductor device according to claim 1, wherein the plurality of electrodes of the first semiconductor element comprise a first drain electrode, a first source electrode and a first gate electrode, and the plurality of electrodes of the second semiconductor element comprise a second drain electrode, a second source electrode and a second gate electrode.

9. The semiconductor device according to claim 8, wherein the first obverse surface has a first edge portion and a second edge portion that is farther away from the second semiconductor element than is the first edge portion, the first gate electrode being disposed at a location adjacent to the second edge portion in the first direction, and
   the second obverse surface has a first edge portion and a second edge portion that is farther away from the first semiconductor element than is the first edge portion of the second obverse surface, the second gate electrode being disposed at a location adjacent to the second edge portion of the second obverse surface in the first direction.

10. The semiconductor device according to claim 9, wherein the first drain electrode and the first source electrode have a band shape elongated in the first direction and are disposed side by side in the second direction,
   the second drain electrode and the second source electrode have a band shape elongated in the first direction and are disposed side by side in the second direction.

11. A semiconductor device comprising:
   a first semiconductor element including a first obverse surface and a first reverse surface that are spaced apart in a thickness direction, the first obverse surface being provided with a plurality of electrodes;
   a second semiconductor element including a second obverse surface and a second reverse surface that are spaced apart in the thickness direction, the second obverse surface being provided with a plurality of electrodes;
   a control element including a third obverse surface and a third reverse surface that are spaced apart in the thickness direction, the control element being configured to control the first semiconductor element and the second semiconductor element;
a first conductive member facing the first reverse surface and supporting the first semiconductor element;
a second conductive member facing the second reverse surface and supporting the second semiconductor element;
a third conductive member facing the third reverse surface and supporting the control element;
a plurality of leads each spaced apart from the first conductive member, the second conductive member and the third conductive member; and
a sealing resin that covers the first semiconductor element, the second semiconductor element and the control element, while also covering at least partially the first conductive member, the second conductive member, the third conductive member and the plurality of leads,
wherein each of the plurality of leads comprises an exposed part uncovered with the sealing resin, and the exposed part of each lead is formed with a chamfered recessed portion extending along an outer circumference of the sealing resin as viewed in the thickness direction.

12. The semiconductor device according to claim 11, wherein each of the first conductive member, the second conductive member and the third conductive member comprises an exposed part uncovered with the sealing resin, and the exposed part of each conductive member is formed with a chamfered recessed portion extending along the outer circumference of the sealing resin as viewed in the thickness direction.

13. The semiconductor device according to claim 11, wherein each of the first semiconductor element and the second semiconductor element comprises a switching element.

14. The semiconductor device according to claim 11, further comprising a connecting member that electrically connects one of the plurality of electrodes of the first semiconductor element to the first conductive member.

15. The semiconductor device according to claim 11, further comprising a connecting member that electrically connects one of the plurality of electrodes of the second semiconductor element to the first conductive member.

16. The semiconductor device according to claim 11, further comprising a connecting member that electrically connects one of the plurality of electrodes of the second semiconductor element to the second conductive member.

17. The semiconductor device according to claim 11, wherein the plurality of electrodes of the first semiconductor element comprise a first drain electrode, a first source electrode and a first gate electrode, and the plurality of electrodes of the second semiconductor element comprise a second drain electrode, a second source electrode and a second gate electrode.

18. The semiconductor device according to claim 17, wherein the first obverse surface has a first edge portion and a second edge portion that is farther away from the second semiconductor element than is the first edge portion, the first gate electrode being disposed at a location adjacent to the second edge portion in a first direction perpendicular to the thickness direction, and
the second obverse surface has a first edge portion and a second edge portion that is farther away from the first semiconductor element than is the first edge portion of the second obverse surface, the second gate electrode being disposed at a location adjacent to the second edge portion of the second obverse surface in the first direction.

19. The semiconductor device according to claim 18, wherein the first drain electrode and the first source electrode have a band shape elongated in the first direction and are disposed side by side in a second direction perpendicular to the thickness direction and the first direction,
the second drain electrode and the second source electrode have a band shape elongated in the first direction and are disposed side by side in the second direction.

20. The semiconductor device according to claim 11, wherein each of the first semiconductor element and the second semiconductor element comprises gallium nitride as a constituent material thereof.

* * * * *